United States Patent
Maeda

(10) Patent No.: US 9,400,436 B2
(45) Date of Patent: Jul. 26, 2016

(54) DETECTION DEVICE, EXPOSURE APPARATUS, AND DEVICE MANUFACTURING METHOD USING SAME

(71) Applicant: CANON KABUSHIKI KAISHA, Tokyo (JP)

(72) Inventor: Hironori Maeda, Utsunomiya (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 247 days.

(21) Appl. No.: 14/055,323

(22) Filed: Oct. 16, 2013

(65) Prior Publication Data

US 2014/0111788 A1    Apr. 24, 2014

(30) Foreign Application Priority Data

Oct. 19, 2012   (JP) .................. 2012-231653

(51) Int. Cl.
*G03B 27/52* (2006.01)
*G03F 7/20* (2006.01)
*G03F 9/00* (2006.01)
*G01B 11/06* (2006.01)

(52) U.S. Cl.
CPC ............ *G03F 7/70641* (2013.01); *G01B 11/06* (2013.01); *G03F 9/7026* (2013.01); *G03F 9/7084* (2013.01); *G03F 9/7088* (2013.01)

(58) Field of Classification Search
CPC .. G01B 11/06; G01B 11/0616; G03F 9/7026; G03F 9/7084; G03F 9/7088; G03F 7/70608; G03F 7/70641; G03F 7/70666; G03F 7/7085
USPC ........... 355/52, 53, 55, 72–75, 77; 250/492.1, 250/492.2, 492.22, 493.1, 548; 356/496, 356/503, 504, 511–516, 609, 624, 614, 356/630–632
See application file for complete search history.

(56) References Cited

U.S. PATENT DOCUMENTS 5,474,647 A * 12/1995 Poultney et al. ................... 438/5
5,602,400 A *  2/1997 Kawashima .................. 250/548
5,671,054 A *  9/1997 Iwasaki ........................ 356/631

(Continued)

FOREIGN PATENT DOCUMENTS

| JP | 2002280299 A |   | 9/2002 |
| JP | 2008096605 A | * | 4/2008 |
| TW | 200938803 A |   | 9/2009 |

OTHER PUBLICATIONS

English translation of JP 2008-096605, published on Apr. 24, 2008.*

(Continued)

*Primary Examiner* — Christina Riddle
(74) *Attorney, Agent, or Firm* — Rossi, Kimms & McDowell LLP

(57) ABSTRACT

A detection device that detects a mark provided on the back side of an object, the detection device includes a first detection unit configured to detect the mark from a surface side of the object; a second detection unit configured to detect a surface position of the object; and a processing unit. The processing unit determines a thickness of the object based on a difference between a first focus position acquired with reference to the position of the mark detected by the first detection unit and a second focus position acquired with reference to the surface position detected by the second detection unit.

14 Claims, 19 Drawing Sheets

(56) References Cited

U.S. PATENT DOCUMENTS

| | | | |
|---|---|---|---|
| 5,744,814 A * | 4/1998 | Uchiyama | 250/559.27 |
| 5,781,303 A * | 7/1998 | Berndt | 356/632 |
| 6,172,752 B1 * | 1/2001 | Haruna et al. | G01B 11/06 356/485 |
| 6,376,329 B1 * | 4/2002 | Sogard et al. | 438/401 |
| 7,064,807 B2 | 6/2006 | Gui et al. | |
| 2002/0109825 A1 * | 8/2002 | Gui et al. | 355/53 |
| 2003/0090671 A1 * | 5/2003 | Takahashi et al. | 356/479 |
| 2003/0210408 A1 * | 11/2003 | Jun et al. | 356/630 |
| 2011/0033790 A1 | 2/2011 | Mishima | |
| 2013/0230798 A1 * | 9/2013 | Maeda | G01B 11/002 430/30 |

OTHER PUBLICATIONS

European Search Report issued in European counterpart application No. EP13004976.0, dated May 15, 2015.

Office Action issued in TW102136354, mailed Aug. 13, 2015. English translation provided.

* cited by examiner

DETECTION DEVICE, EXPOSURE APPARATUS, AND DEVICE MANUFACTURING METHOD USING SAME

BACKGROUND OF THE INVENTION

1. Field of the Invention

The present invention relates to a detection device, an exposure apparatus, and a device manufacturing method using the same.

2. Description of the Related Art

There has been used a projection exposure apparatus (exposure apparatus) that projects a pattern written on a reticle onto a wafer or the like and transfers the pattern thereto via a projection optical system as an apparatus for manufacturing a device (e.g., a semiconductor element, a liquid crystal display element, or a thin-film magnetic head) using a lithography technique. At this time, the projection exposure apparatus performs exposure after a pattern transfer region present on a wafer is aligned in a position at which a reticle pattern image is formed using an alignment detection system (detection device) installed in the interior of the projection exposure apparatus.

In recent years, special elements such as stacked devices using a through-VIA such as MEMSs, CMOS image sensors (CIS), and the like in addition to IC chips such as conventional memories and logics have come to be used and manufactured by using an exposure apparatus. Elements such as MEMSs, CISs, and the like differ at some point from IC chips. In the elements such as MEMSs, CISs, and the like, line width resolution and superposition accuracy required for IC chips are not demanding but a deep focal depth is required. Also, as a special step of manufacturing elements such as MEMSs, CISs, and the like, there is a step of forming an alignment mark on the back side of a Si wafer and then exposing the front side of the Si wafer while being aligned with the mark provided on the back side of the Si wafer. An exemplary representative application is that, after thinning the Si wafer, a through-VIA is formed from the front side of the Si wafer to thereby be conductively communicatable with the circuit provided on the back side of the Si wafer. Japanese Patent Laid-Open No. 2002-280299 discloses a lithography apparatus that forms an image of the alignment mark formed on the back side of a Si wafer on the front side thereof and then detects the position of the alignment mark on the front side of the Si wafer using an alignment detection system configured on the back side (wafer chuck side). However, in the lithography apparatus including an alignment detection system configured on the back side of a Si wafer, a hole is provided at a specified position of a wafer chuck, and thus, only the alignment mark at the specified position can be detected. Thus, in the method disclosed in Japanese Patent Laid-Open No. 2002-280299, an alignment mark which is arranged at any position over the back side of a wafer cannot be observed.

Here, the Si wafer is transmissive in respect of infrared light (wavelength of 1,000 nm or greater). In recent years, in contrast to the configuration disclosed in Japanese Patent Laid-Open No. 2002-280299, there has been proposed a method for observing the alignment mark formed on the back side of the Si wafer from the front side thereof using a position detection system which uses infrared light as a light source. In this case, in the normal alignment sequence, in order to measure the best focus position of the alignment mark, an image of the alignment mark is acquired while the wafer stage is being driven in the optical axis direction of the alignment detection system to thereby calculate the position with highest contrast. Hereinafter, such a measuring method is referred to as "image autofocus measurement". In the image autofocus measurement, measurement is started from the height of the reference plate, so that the alignment mark formed on the front side of the Si wafer can be quickly and readily detected. However, when there is an alignment mark formed on the back side of the Si wafer, the alignment detection system is in-focus at the reference plate during a normal operation, resulting in the failures below. For example, if the wafer stage is driven from the reference plate which is the default focus position of the alignment detection system, a large search area needs to be taken for detecting the alignment mark provided on the back side of the Si wafer. At this time, increasing the search area means that more time is required for measurement, resulting in a reduction in throughput. Furthermore, when the measurement pitch of the image autofocus measurement increases, the computed errors of the best focus position of the alignment mark increase, so that highly-accurate alignment cannot be achieved.

On the other hand, in order to form the through-VIA from the front side of the Si wafer to thereby be conductively communicatable with the circuit provided on the back side of the Si wafer, the Si wafer needs to be thinned in advance by a wafer thinning device. At this time, the thinning device firstly determines processing conditions for achieving a desired wafer thickness and then performs thinning of the Si wafer. However, the thickness of the thinned Si wafer is readily varied due to the change over time or the like of the thinning device. For example, when a photo sensor is produced via a back side illumination (BSI) process, the variation in thickness of the wafer affects the characteristics of the photo sensor, the wafer thickness management is particularly important. The variation in thickness of the wafer may affect not only the detection of the alignment mark formed on the back side of the Si wafer but also wafer handling. For example, the thinned Si wafer exhibits a weak mechanical strength, resulting in a high cracking tendency during handling. Furthermore, in the through-VIA step, the through-VIA is formed by etching the Si wafer subjected to thinning. However, if there is variation in thickness of the Si wafer, the VIA formed by etching may not properly penetrate the Si wafer. In contrast, if the etching time by the etching device is too long in order to surely penetrate the VIA, the VIA may also penetrate an etching stop layer, resulting in a destruction of the device itself underling the etching stop layer. Consequently, the variation in thickness of the Si wafer may affect the yield of devices to be manufactured. Accordingly, if the thickness of the Si wafer can be detected by the alignment detection system in the exposure apparatus, the variation in thickness of the Si wafer can be feedback to the thinning device by automatically and periodically monitoring the thickness of the Si wafer. Furthermore, if the detected wafer thickness is feedback to the etching device, the through-VIA can be formed at the optimum etching time, resulting in an improvement in yield of devices.

SUMMARY OF THE INVENTION

The present invention has been made in view of the aforementioned circumstances and an object of the present invention is to provide a detection device that is advantageous for quickly detecting the position of the mark provided on the back side of an object to be measured and the thickness of the object to be measured with high accuracy.

According to an aspect of the present invention, a detection device that detects a mark provided on the back side of an object to be measured is provided and includes a first detection unit configured to detect the mark from a surface side of the object to be measured; a second detection unit configured to detect a surface position of the object to be measured; and a processing unit. The processing unit determines a thickness of the object to be measured based on a difference between a first focus position acquired with reference to the position of the mark detected by the first detection unit and a second focus position acquired with reference to the surface position detected by the second detection unit.

According to the present invention, a detection device that is advantageous for quickly detecting the position of the mark provided on the back side of an object to be measured and the thickness of the object to be measured with high accuracy may be provided.

Further features of the present invention will become apparent from the following description of exemplary embodiments with reference to the attached drawings.

DESCRIPTION OF THE EMBODIMENTS

Hereinafter, preferred embodiments of the present invention will now be described in detail with reference to the accompanying drawings.

First Embodiment

Figure 3:
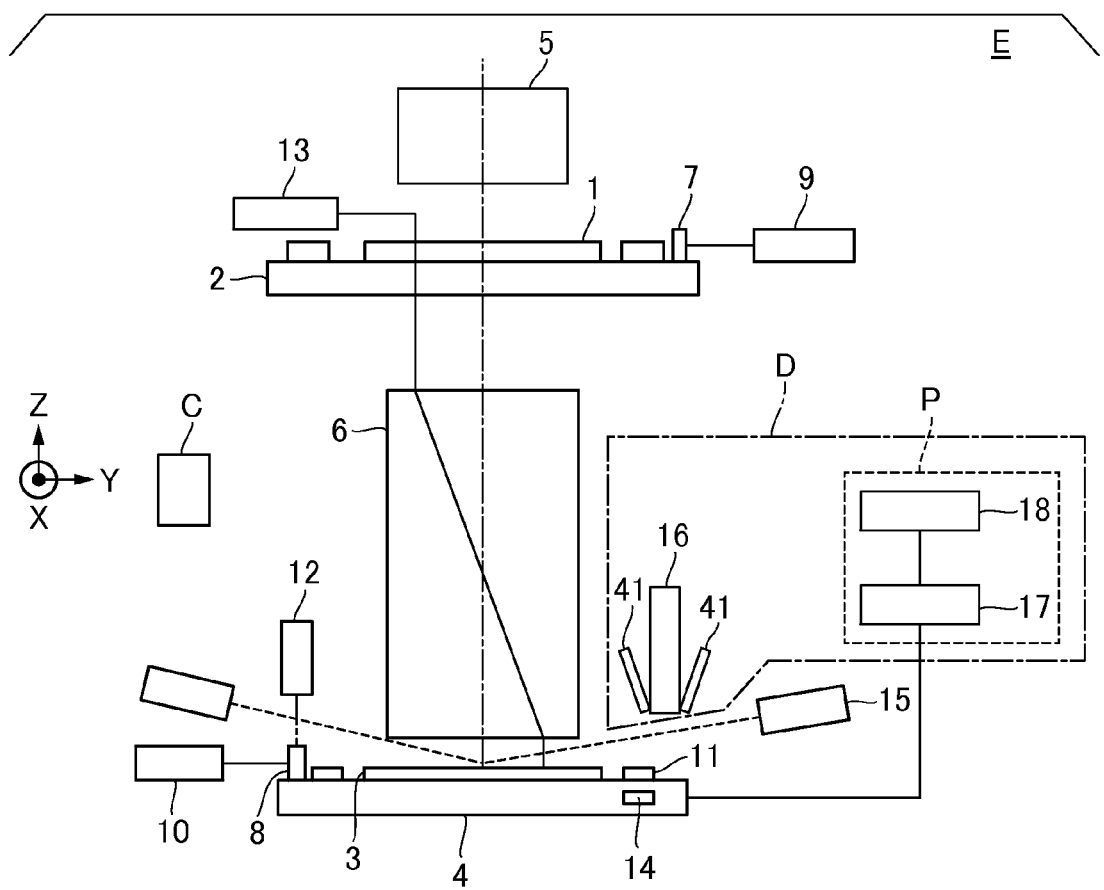
FIG. 3 is a diagram illustrating the configuration of an exposure apparatus.

Firstly, a description will be given of the configuration of a detection device according to a first embodiment of the present invention and an exposure apparatus including the detection device. FIG. 3 is a schematic diagram illustrating the configuration of an exposure apparatus E according to the present embodiment. The exposure apparatus E includes a detection device D that includes a wafer alignment detection system (first detection unit) 16 shown in FIG. 1 and a focus detection system (second detection unit) 41 that provides support for detecting the best focus position of the wafer alignment detection system 16 by detecting the surface position of a wafer 3. Hereinafter, the focus detection system 41 is referred to as an "AF detection system". The exposure apparatus E further includes a reticle stage 2, a wafer stage (substrate stage) 4, an illumination optical system 5, a projection optical system 6, and a control unit C. The reticle stage 2 supports a reticle (original) 1. The wafer stage 4 supports a wafer (substrate, object to be measured) 3. The illumination optical system 5 illuminates a reticle 1 with exposure light. The projection optical system 6 projects the pattern image of the reticle 1 illuminated with exposure light onto the wafer 3 supported by the wafer stage 4. The control unit C performs integrated control of the operation of the entire exposure apparatus E.

In the present embodiment, a scanning-type exposure apparatus (scanning stepper) that projects the pattern formed on the reticle 1 onto the wafer 3 for exposure while synchronously moving both the reticle 1 and the wafer 3 in the scanning direction is used as the exposure apparatus E. The exposure apparatus E may also be an exposure apparatus (stepper) that fixes the reticle 1 and projects the pattern of the reticle 1 onto the wafer 3 for exposure. The direction parallel to the optical axis of the projection optical system 6 is defined as the Z direction, the synchronous moving direction (scanning direction) of the reticle 1 and the wafer 3 within a plane perpendicular to the optical axis is defined as the Y direction, and the direction (non-scanning direction) orthogonal to the Y direction within the plane is defined as the X direction. The directions of rotation about the X-axis, the Y-axis, and the Z-axis extending in the X direction, the Y direction, and the Z direction, respectively, are defined as the θX-, θY-, and θZ-directions, respectively.

A predetermined illumination area on the reticle 1 is illuminated with exposure light having a uniform illumination distribution using the illumination optical system 5. As exposure light emitted from the illumination optical system 5, light emitted from a mercury lamp KrF excimer laser or an ArF excimer laser having a shorter wavelength than that of the KrF excimer laser may be used.

The reticle stage 2 is capable of two-dimensional movement and θZ-directional fine rotation within a plane perpendicular to the optical axis of the projection optical system 6, that is, within the XY plane. The reticle stage 2 is drivable about at least one axis but may also be drivable about six axes. The reticle stage 2 is driven by a drive unit (not shown) such as a linear motor or the like, and the drive unit is controlled by the control unit C. A mirror 7 is provided on the reticle stage 2 and a laser interferometer 9 for XY directions is provided at a position facing the mirror 7. The two-dimensional position and the rotation angle of the reticle 1 are measured in real time by the laser interferometer 9, and the measurement results are output to the control unit C. The control unit C drives the drive unit of the reticle stage 2 based on the measurement results obtained by the laser interferometer 9 to thereby cause the drive unit to perform positioning of the reticle 1 supported by the reticle stage 2.

The projection optical system 6 performs projection exposure of the pattern of the reticle 1 onto the wafer 3 with a predetermined projection magnification β and is constituted by a plurality of optical elements. The projection optical system 6 is a reduction projection system with a projection magnification β of from ½ to ⅕. The wafer stage (substrate holding unit, holding unit) 4 includes a Z stage for holding the wafer 3 via the wafer chuck, an XY stage for supporting the Z stage, and a base for supporting the XY stage. The wafer stage 4 is driven by a drive unit (not shown) such as a linear motor or the like. The drive unit of the wafer stage 4 is controlled by the control unit C.

A mirror 8 is provided on the wafer stage 4. A laser interferometer 10 for XY directions and a laser interferometer 12 for Z direction are provided at a position facing the mirror 8. The XY direction position and the θZ of the wafer stage 4 are measured in real time by the laser interferometer 10, and the measurement results are output to the control unit C. The Z direction position and the θX and θY of the wafer stage 4 are measured in real time by the laser interferometer 12, and the measurement results are output to the control unit C. The control unit C drives the XYZ stage through the drive unit of the wafer stage 4 based on the measurement results obtained by the laser interferometers 10 and 12 to thereby adjust the position of the wafer 3 in the XYZ directions and cause the drive unit to perform positioning of the wafer 3 supported by the wafer stage 4.

A reticle alignment detection system 13 that detects a reference mark 39 (FIG. 4) provided on a reference plate 11 on the wafer stage 4 through a reference mark (not shown) on the reticle 1 and the projection optical system 6 is provided in the vicinity of the reticle stage 2. The reticle alignment detection system 13 incorporates a photoelectric conversion element (e.g., CCD camera or the like) that illuminates the reference mark on the reticle 1 and the reference mark 39 through the projection optical system 6 to thereby detect light reflected therefrom by using the same light source as that for exposing the wafer 3. The reticle alignment detection system 13 aligns the position of the reference mark on the reticle 1 with the position of the reference mark 39 on the reference plate 11 so as to be in the focused state, so that the relative positional relationship (X, Y, Z) between the reticle 1 and the wafer 3 can be achieved.

The reference mark 39 to be detected by the reticle alignment detection system 13 may also be a reflection-type mark. A transmission-type reference mark 39 can also be detected by using a transmission-type reticle alignment detection system 14. The transmission-type reticle alignment detection system 14 incorporates a light amount sensor that illuminates the reference mark on the reticle 1 and the reference mark 39 through the projection optical system 6 to thereby detect light transmitted therethrough by using the same light source as that for exposing the wafer 3 and the illumination optical system 5. The amount of transmitted light is measured while the wafer stage 4 is being driven in the X direction (or the Y direction) and the Z direction, so that the position of the reference mark on the reticle 1 can be aligned with the position of the reference mark 39 on the reference plate 11 so as to be in the focused state. As described above, the relative positional relationship (X, Y, Z) between the reticle 1 and the wafer 3 can be achieved by using either the reticle alignment detection system 13 or the transmission-type reticle alignment detection system 14.

Figure 4:
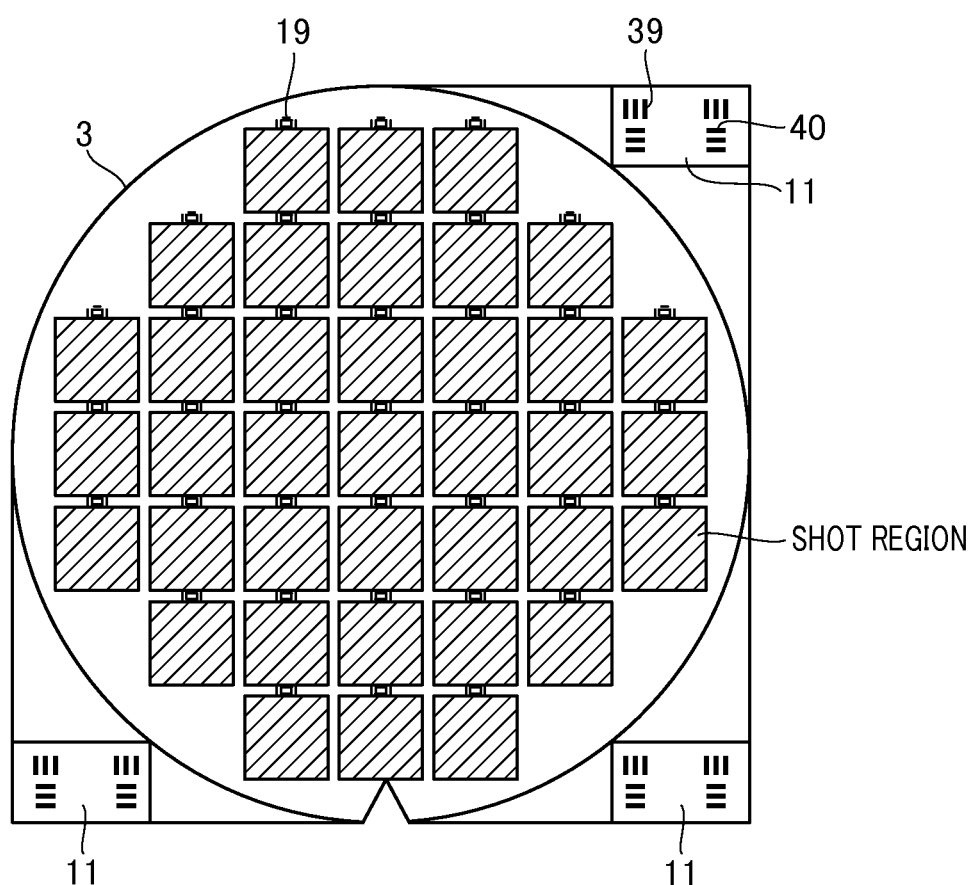
FIG. 4 is a diagram illustrating the shape and arrangement of reference marks on a wafer stage.

FIG. 4 is a plan view illustrating the shape and arrangement of reference marks provided on the wafer stage 4. The reference plate 11 is provided at a corner of the wafer stage 4 at approximately the same height as the surface of the wafer 3. The reference plate 11 includes a reference mark 40 to be detected by the wafer alignment detection system 16 and the reference mark 39 to be detected by the reticle alignment detection system 13 or the transmission-type reticle alignment detection system 14. The reference plate 11 may also be arranged at a plurality of corners of the wafer stage 4. The reference plate 11 may also include a plurality of reference marks 39 and a plurality of reference marks 40. The positional relationship (in the XY direction) between the reference mark 39 for reticle alignment and the reference mark 40 for wafer alignment is a predetermined known relationship. The reference mark 40 for wafer alignment and the reference mark 39 for reticle alignment may also be a common mark.

A focus detection system 15 includes a projection system that projects detection light on the surface of the wafer 3 and a light receiving system that receives reflection light from the wafer 3. The detection result obtained by the focus detection system 15 is output to the control unit C. The control unit C drives the Z stage based on the detection result obtained by the focus detection system 15 to thereby adjust the Z-directional position (focus position) and the inclination angle of the wafer 3 held by the Z stage so as to fall within an allowable range.

The wafer alignment detection system 16 includes a projection system that projects detection light onto the mark 19 on the wafer 3 and the reference mark 40 for wafer alignment detection on the reference plate 11 and a light receiving system that receives reflection light from the mark. The detection result obtained by the wafer alignment detection system 16 is output to the control unit C. The control unit C drives the wafer stage 4 in the XY direction based on the detection result obtained by the wafer alignment detection system 16 so that the position of the wafer 3 held by the wafer stage 4 in the XY direction can be adjusted. The exposure apparatus E includes an AF detection system (focus detection system) 41 that detects the surface position of the wafer 3 in order to quickly acquire the best focus position of the wafer alignment detection system 16. As in the focus detection system 15, the AF detection system 41 includes a projection system that projects detection light onto the surface of the wafer 3 and a light receiving system that receives reflection light from the wafer 3. The focus detection system 15 is used for acquiring the best focus position of the projection optical system 6, whereas the AF detection system 41 is used for acquiring the best focus position of the wafer alignment detection system 16.

The wafer alignment detection system 16 is mainly classified into two types. The first type is an off-axis alignment detection system (Off-axis AA, OA detection system) that is separately configured without the intermediary of the projection optical system 6 and optically detects the mark 19 and the reference mark 40 on the wafer 3. The second type is a TTL-AA (Through The Lens alignment) system that detects the mark 19 and the reference mark 40 using an alignment wavelength of non-exposure light via the projection optical system 6 which is particularly used in an i-ray exposure apparatus. In the present embodiment, a description will be given by taking an example of the OA detection-type wafer alignment detection system 16 but the TTL-AA-type wafer alignment detection system 16 may also be used.

Figure 1:
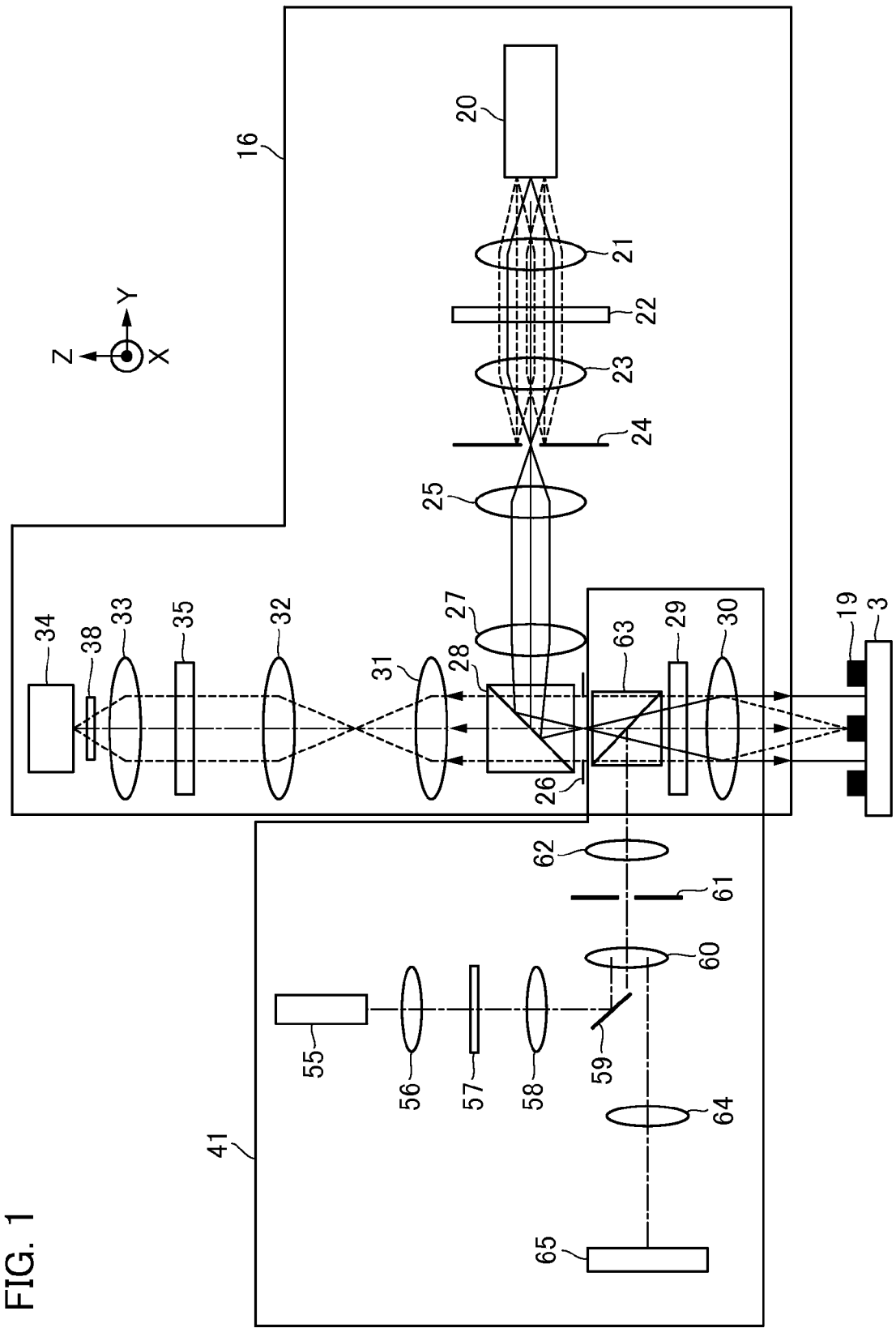
FIG. 1 is a diagram illustrating the configuration of a wafer alignment detection system and an AF detection system.
Figure 2:
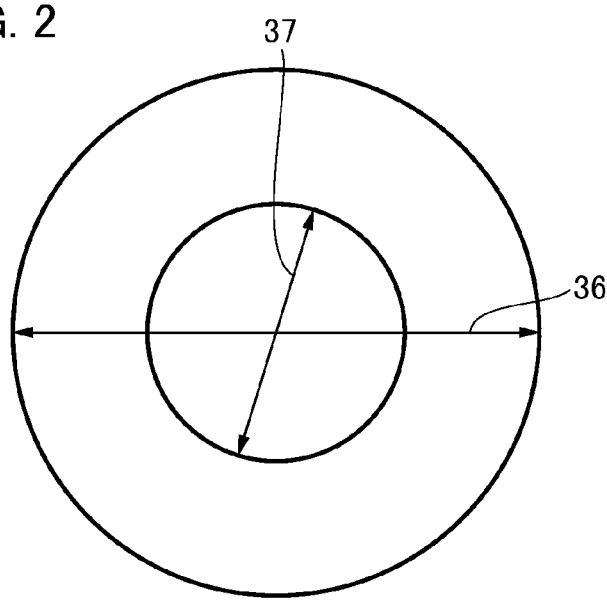
FIG. 2 is a diagram illustrating beam diameters at an aperture stop and an illumination light source provided in the detection system shown in FIG. 1.

FIG. 1 is a schematic diagram illustrating the configuration of the wafer alignment detection system 16 and the AF detection system 41 that are provided in the detection device D. The illumination light source 20 of the wafer alignment detection system 16 emits infrared light (e.g., 1000 to 1500 nm) and visible light (e.g., 400 to 800 nm). Light emitted from the illumination light source 20 passes through a first relay optical system 21, a wavelength filter plate 22, and a second relay optical system 23 to thereby reach an aperture stop 24 which is arranged on the pupil plane (an optical Fourier transform plane to an object plane) of the wafer alignment detection system 16. FIG. 2 is a comparison diagram illustrating the difference between beam diameters at the illumination light source 20 and the aperture stop 24. As shown in FIG. 2, a beam diameter 37 at the aperture stop 24 is sufficiently smaller than a beam diameter 36 at the illumination light source 20.

The wavelength filter plate 22 includes a plurality of filters each having a different transmission wavelength band and performs switching of filters in accordance with a command given by the control unit C. The aperture stop 24 includes a plurality of apertures each having a different illumination σ and performs switching of apertures in accordance with a command given by the control unit C so as to change the illumination σ. In the present embodiment, the wavelength filter plate 22 and the aperture stop 24 includes a plurality of filters and a plurality of apertures, respectively. However, a plurality of filters and a plurality of apertures may also be separately added in addition to the wavelength filter plate 22 and the aperture stop 24. The wavelength filter plate 22 of the present embodiment includes a filter which allows the passage of visible light and a filter which allows the passage of infrared light, and the wavelength of light used for mark detection can be selected by switching these filters. When the mark formed on the back side of the Si wafer which is transmissive to infrared light is measured, a filter which allows the passage of infrared light is used.

Light arriving at the aperture stop 24 is guided to a polarizing beam splitter 28 by passing through a first illumination optical system 25 and a second illumination optical system 27. S-polarized light which is reflected from the polarizing beam splitter 28 and is vertical to the plane of the sheet is converted into circularly polarized light by passing through an NA aperture 26, a prism 63, and a λ/4 plate 29 and illuminates the mark 19 formed on the wafer 3 through an object lens 30 (illumination light is shown by solid lines in FIG. 1). The NA aperture 26 can change NA by changing the amount of aperture. The amount of aperture of the NA aperture 26 can be changed by a command given by the control unit C. Although a description will be given below of the prism 63 with reference to FIG. 5, the prism 63 has alignment light transmissive properties.

Reflection light (shown by single-dot broken lines in FIG. 1) from the mark 19 is now converted into p-polarized light which is parallel to the plane of the sheet by again passing through the object lens 30 and the λ/4 plate 29. The p-polarized light passes through the prism 63 and the polarizing beam splitter 28 and then passes through a relay lens 31, a first imaging optical system 32, an optical member 35 for adjusting coma aberration, a second imaging optical system 33, and an optical member 38 for adjusting a wavelength shift difference. The p-polarized light passed through the optical member 38 forms a detection signal of the mark 19 on a photoelectric conversion element 34 (e.g., CCD camera).

In general, when the mark 19 is observed to thereby detect the position of the mark 19 by using the wafer alignment detection system 16, monochromatic light or light in a narrow wavelength band may lead to the occurrence of interference fringes due to the presence of a transparent layer coated or formed on the mark 19. Thus, alignment signal is detected with an interference fringe signal being added thereto, so that the mark 19 cannot be detected with high accuracy. Thus, a light source having wide-band wavelength characteristics is generally used as the illumination light source 20 provided in the wafer alignment detection system 16 in order to detect the mark 19 as a signal having a small interference fringe.

Figure 5:
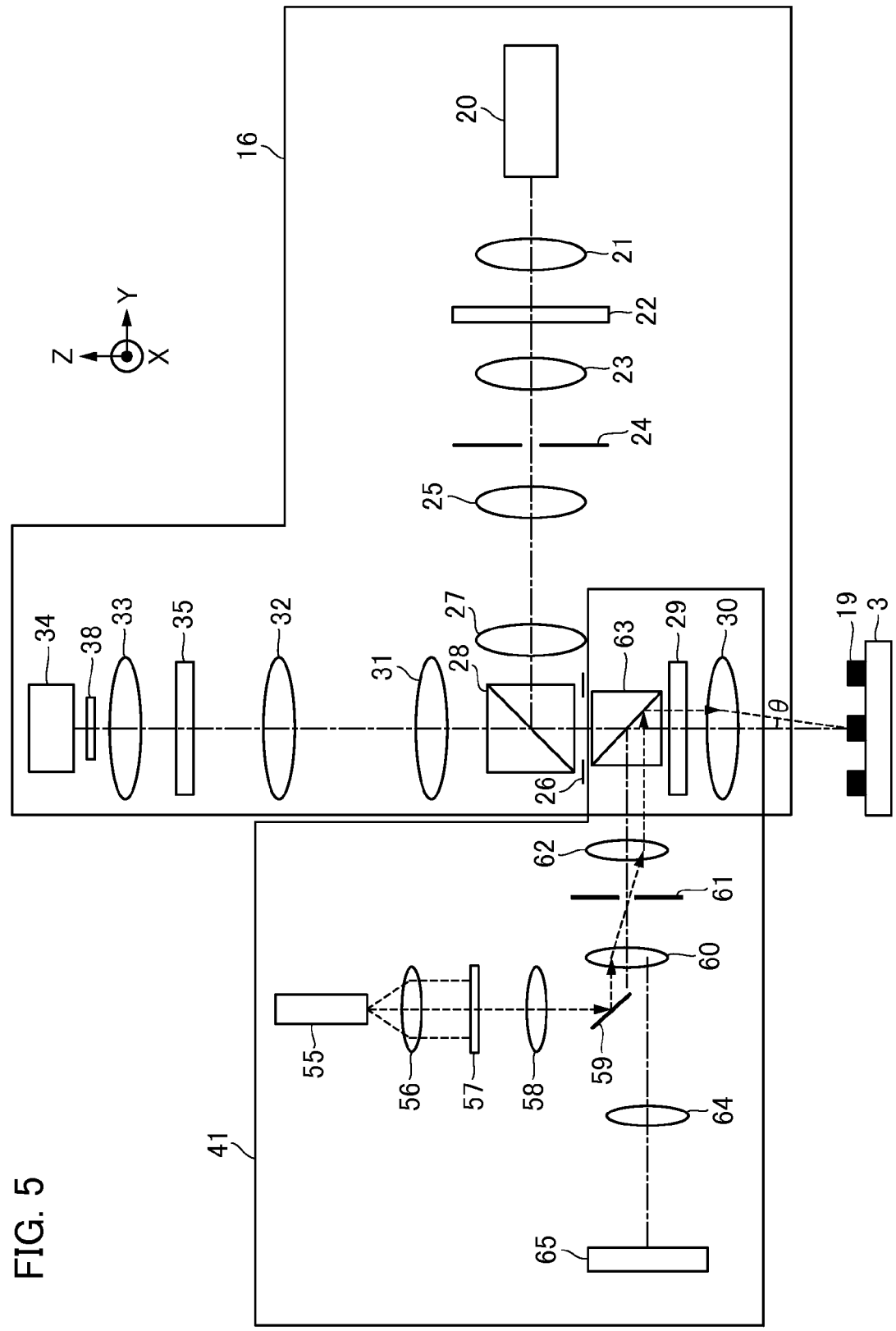
FIG. 5 is a diagram illustrating irradiation of AF light onto a wafer by the AF detection system.
Figure 6:
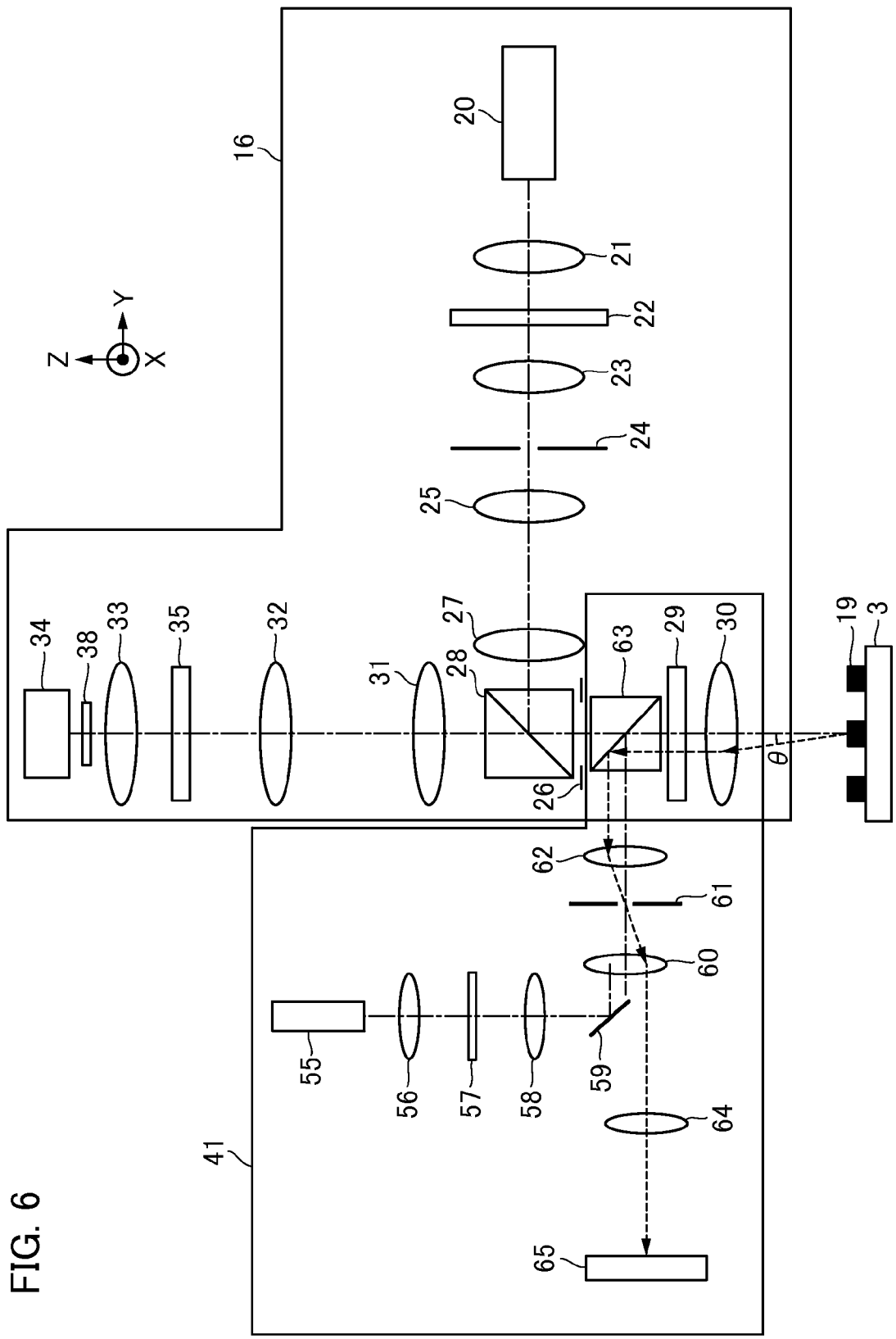
FIG. 6 is a diagram illustrating reception of reflection light emitted from a wafer by the AF detection system.

FIGS. 5 and 6 are diagrams illustrating a state where the AF detection system 41 performs focus measurement. FIG. 5 shows a manner in which the AF detection system 41 irradiates the wafer 3 with focus measurement light (AF light). The AF light emitted from a light source 55 illuminates a pattern plate 57 through a lens 56. The light source 55 emits light in the visible light band (a wavelength not transmitting through Si in the range of 400 to 800 nm). The AF light irradiated onto the wafer 3 does not transmit the wafer 3. The pattern plate 57 is a glass substrate on which a slit pattern is written, and the AF light irradiated onto the slit pattern which is written at the central portion of the pattern plate 57 passes through a lens 58 and is then reflected by a mirror 59 to thereby reach a lens 60. For ease of explanation, the AF light subsequent to the pattern plate 57 is denoted only by a main light beam but is actually a light beam having NA. The AF light reaches a portion eccentric to the center of the lens 60 instead of the center of the lens 60 and passes through a reference mirror 61 by being refracted on the lens 60 to thereby reach a lens 62. The light arriving at the lens 62 also reaches a portion eccentric to the center of the lens 62 instead of the center of the lens 62. The AF light refracted on the lens 62 reaches the prism 63. The prism 63 has properties for reflecting AF light and transmitting light used for alignment. The AF light reflected by the prism 63 passes through the λ/4 plate 29 to thereby reach the lens 30. The AF light reaches a portion eccentric to the center of the lens 30 instead of the center of the lens 30 and is then refracted on the lens 30 to thereby be obliquely incident on the wafer 3 at an angle of incidence of θ as shown in FIG. 5.

FIG. 6 shows a manner in which the illuminated AF light is reflected by the wafer 3 and the reflection light is received by the AF detection system 41. The AF light reflected by the wafer 3 is reflected from the wafer 3 at the same angle of θ as that upon illumination to thereby reach the lens 30. At this time, the AF light reaches a portion eccentric to the center of the lens 30 instead of the center of the lens 30 and then passes through the λ/4 plate 29 by being refracted on the lens 30 to thereby reach the prism 63. The AF light reflected by the prism 63 reaches the lens 62. At this time, the AF light reaches a portion eccentric to the center of the lens 62 instead of the center of the lens 62 and then passes through the reference mirror 61 by being refracted on the lens 62 to thereby reach the lens 60. At this time, the AF light reaches a portion eccentric to the center of the lens 60 instead of the center of the lens 60, reaches the center of a lens 64 by being refracted on the lens 60, and then passes through the lens 64 to thereby be received by an AF detecting sensor 65.

From the description with reference to FIGS. 5 and 6, it can be seen that, when the wafer 3 moves in the focus direction (Z direction), the position at which the AF light is received is displaced accordingly in the AF detecting sensor 65. As described above, the AF detection system 41 can measure the surface position of the wafer 3.

Figure 7:
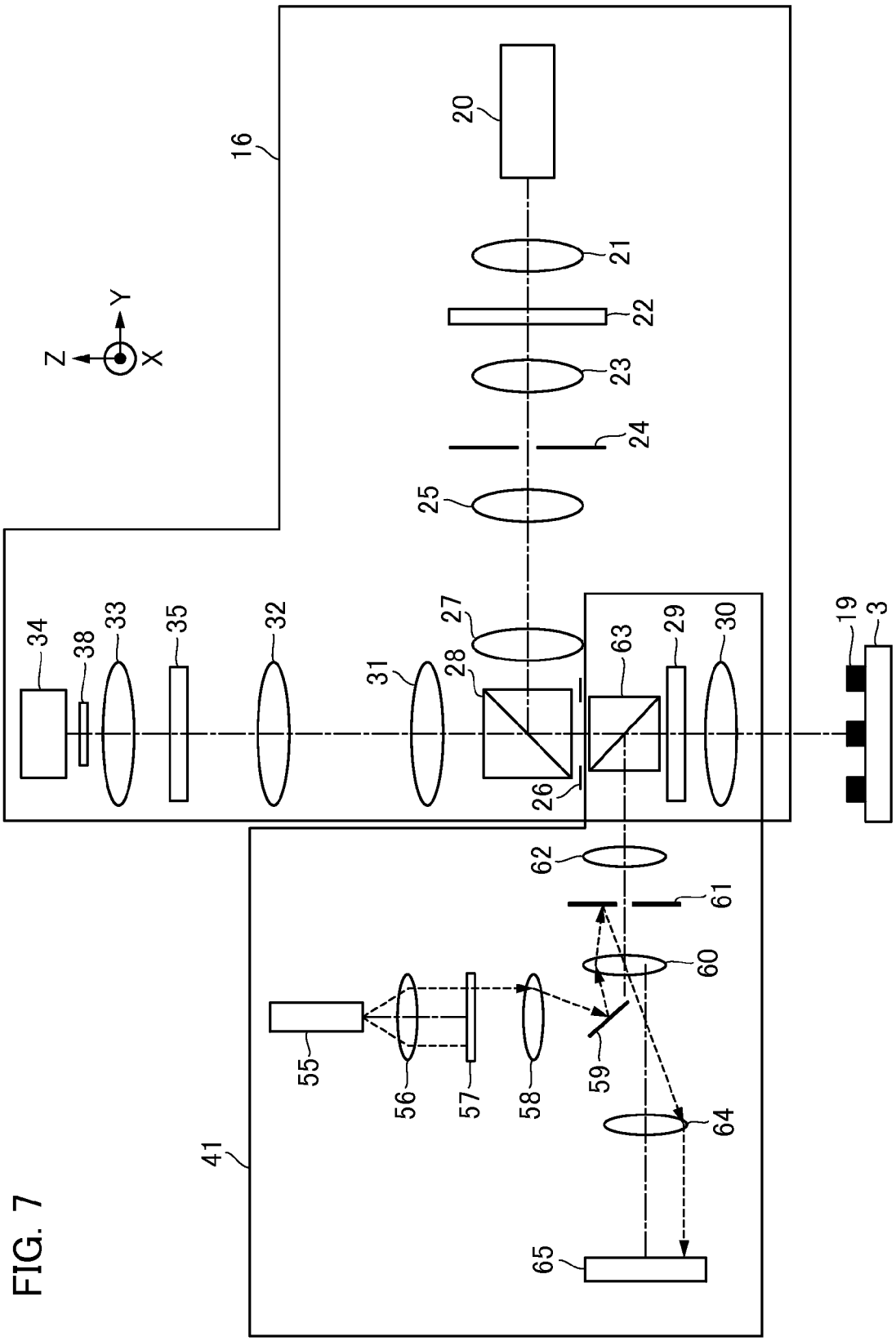
FIG. 7 is a diagram illustrating reference measurement within the AF detection system.

FIG. 7 is a diagram illustrating reference measurement within the AF detection system 41. The AF light irradiated to the periphery of the pattern plate 57 reaches a portion eccentric to the center of the lens 58, is refracted on the lens 58, and is then reflected by the mirror 59. The AF light reflected by the mirror 59 reaches a portion eccentric to the center of the lens 60 and then is reflected by the reference mirror 61 by being refracted on the lens 60 to thereby now reach the center of the lens 60. The AF light passed through the center of the lens 60 reaches a portion eccentric to the center of the lens 64 and is then received by the AF detecting sensor 65 by being refracted on the lens 64. In the reference measurement within the AF detection system 41, the AF light does not reach the wafer 3 but the position of the AF detecting sensor 65 at which the AF light is directly received is the reference of focus measurement by the AF detection system 41. The focus position of the wafer 3 can be determined from the difference between the reference within the AF detection system 41 and the focus measurement result of the wafer 3.

Focus measurement performed by the AF detection system 41 as shown in FIGS. 5 to 7 is not intended to measure the best focus position for detecting the mark 19 by the wafer alignment detection system 16 but is intended to detect the surface position of the wafer 3. In other words, focus measurement performed by the AF detection system 41 is intended to bring the focus state of the image of the mark 19 in the wafer alignment detection system 16 to fall within an allowable range. Thus, the AF detection system 41 detects the AF light reflected from the surface of the wafer 3 and thus cannot directly detect the focus position of the mark provided on the back side of the wafer 3.

Figure 8:
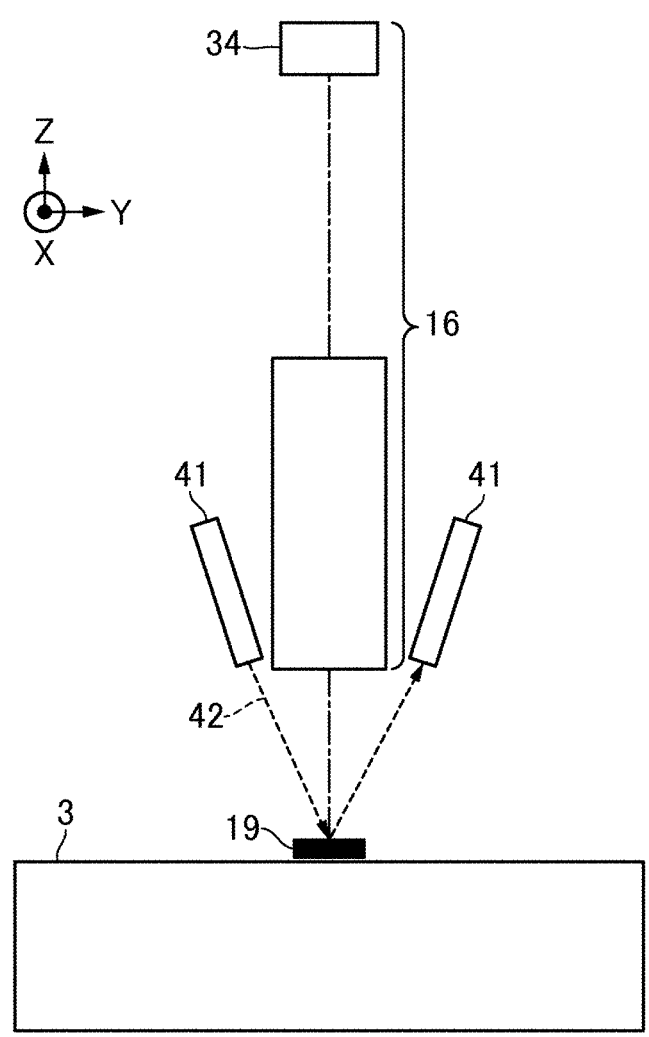
FIG. 8 is a state diagram illustrating measurement of a front-side mark by the AF detection system.
Figure 9:
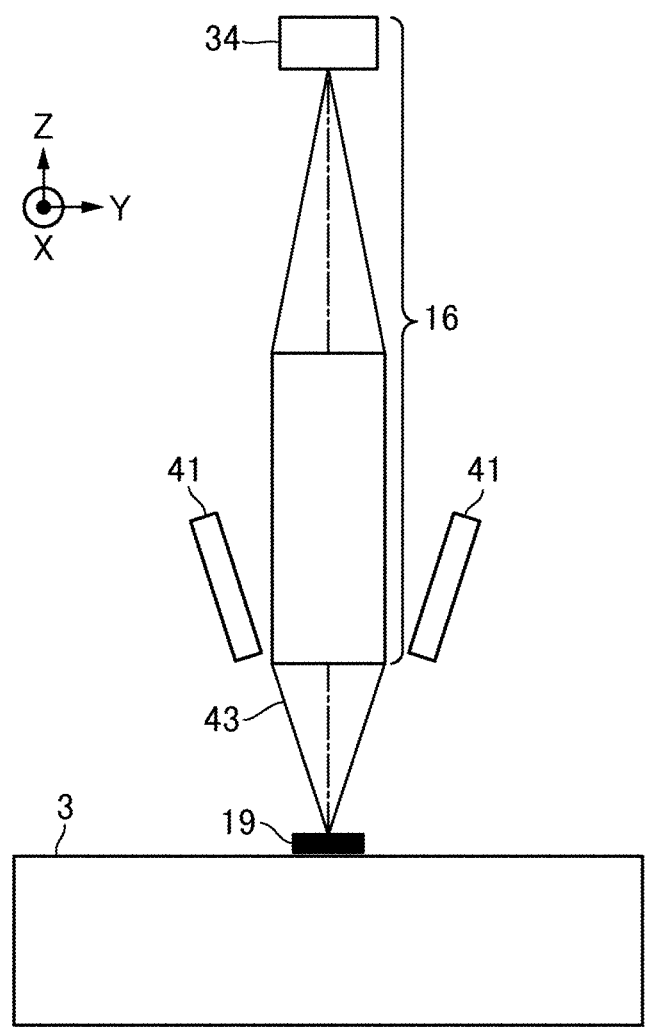
FIG. 9 is a state diagram illustrating measurement of a front-side mark by the wafer alignment detection system.

Next, with reference to FIGS. 8 and 9, a description will be given of how the wafer alignment detection system 16 determines the best focus position for detecting the mark 19 when the mark 19 is arranged on the surface of the wafer 3. In the image autofocus measurement, the AF detection system 41 firstly projects AF light 42 onto the mark 19 formed on the surface of the wafer 3 and then receives reflection light as shown in FIG. 8. While FIG. 8 shows a configuration in which the AF detection system 41 is arranged at the exterior of the wafer alignment detection system 16, the AF detection system 41 may also be arranged in the interior of the wafer alignment detection system 16. The control unit C drives the wafer stage 4 such that the position of the received reflection light comes to the center of the AF detecting sensor 65 in the AF detection system 41, so that the focus position of the mark 19 formed on the surface of the wafer 3 can be acquired. Then, the control unit C can substantially align the focus position of the wafer alignment detection system 16 with the mark 19 using the acquired focus position. FIG. 9 is a diagram illustrating a manner in which the wafer alignment detection system 16 irradiates the mark 19 with measurement light 43 with the wafer alignment detection system 16 being substantially focused on the surface of the wafer 3. Although the AF detection system 41 is focused on the mark 19 formed on the surface of the wafer 3, the AF detection system 41 needs to determine the focus position at which the mark 19 subjected to image processing by the wafer alignment detection system 16 has the highest contrast. The wafer stage 4 is driven in the Z direction from the state shown in FIG. 9 and then the wafer alignment detection system 16 performs alignment measurement at each focus position, so that the focus position at which the mark 19 has the highest contrast can be found (image autofocus measurement). In other words, the AF detection system 41 measures the surface of the wafer 3, and then the wafer alignment detection system 16 performs alignment measurement in the +Z direction and in the −Z direction based on the state where the wafer alignment detection system 16 is substantially focused on the surface of the wafer 3.

Figure 10:
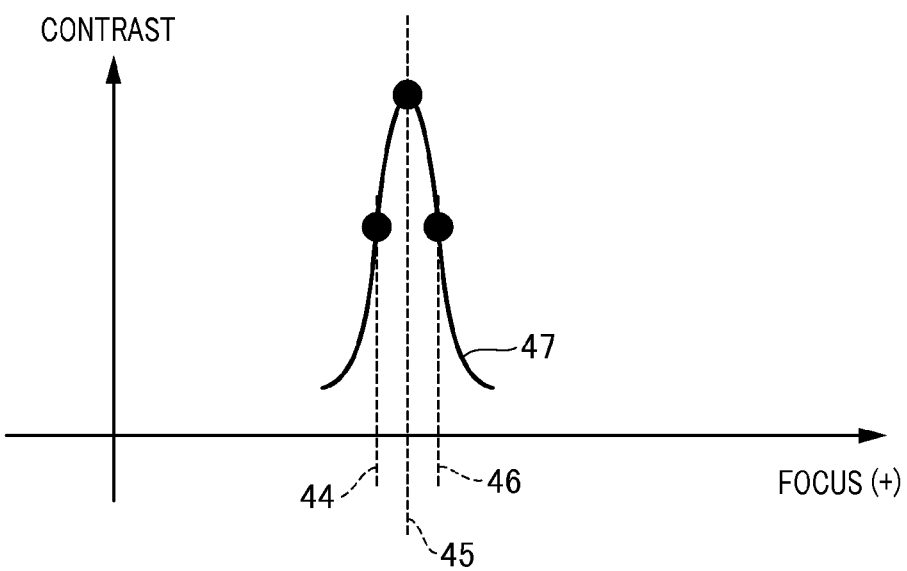
FIG. 10 is a graph illustrating a curve obtained by image autofocus measurement.

FIG. 10 is a graph illustrating a contrast curve 47 obtained by performing image autofocus measurement from the state shown in FIG. 9 using the wafer alignment detection system 16. The best focus position for the wafer alignment detection system 16 having the highest contrast can be determined from the relationship between the focus position and the contrast evaluation value. For example, the focus position having the highest contrast can be determined by secondary fitting or centroiding from the graph shown in FIG. 10. While only three focus positions 44, 45, and 46 obtained by image autofocus measurement are shown in FIG. 10 for ease of explanation, the number of measurement points may be increased to ten, twenty, or greater. It should be noted that an excessive increase in the number of measurement points leads to time consuming for measurement, resulting in a reduction in throughput. As a method for performing image autofocus measurement, a description has been given with reference to FIG. 8 in which the mark 19 is provided on the surface of the wafer 3. However, a resist may be coated on the surface of the wafer 3 as long as the mark 19 is provided in the vicinity of the surface of the wafer 3.

Figure 11:
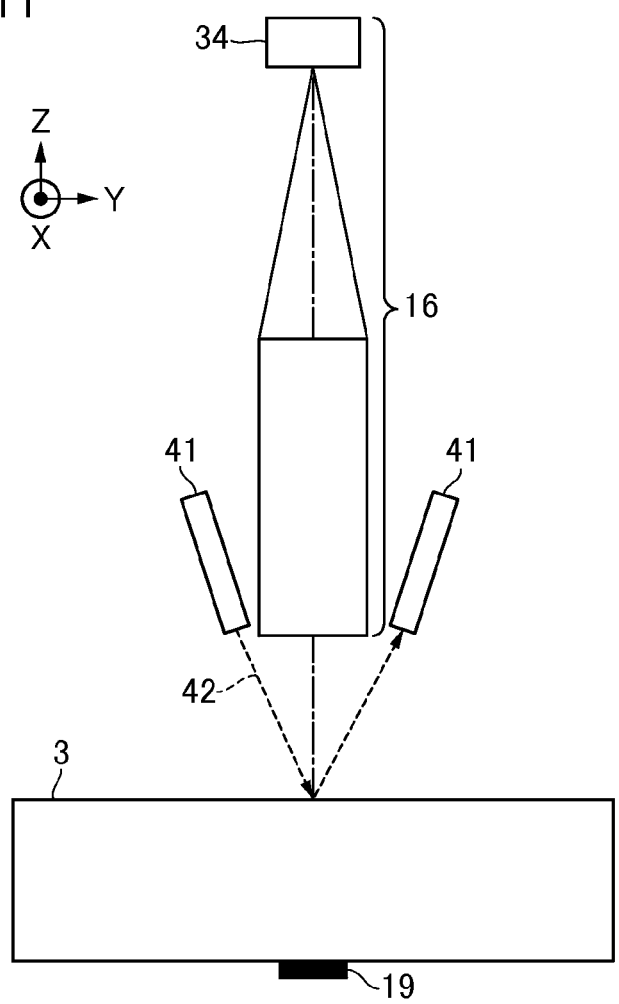
FIG. 11 is a state diagram illustrating measurement of the surface of a wafer provided with a back-side mark by the AF detection system.
Figure 12:
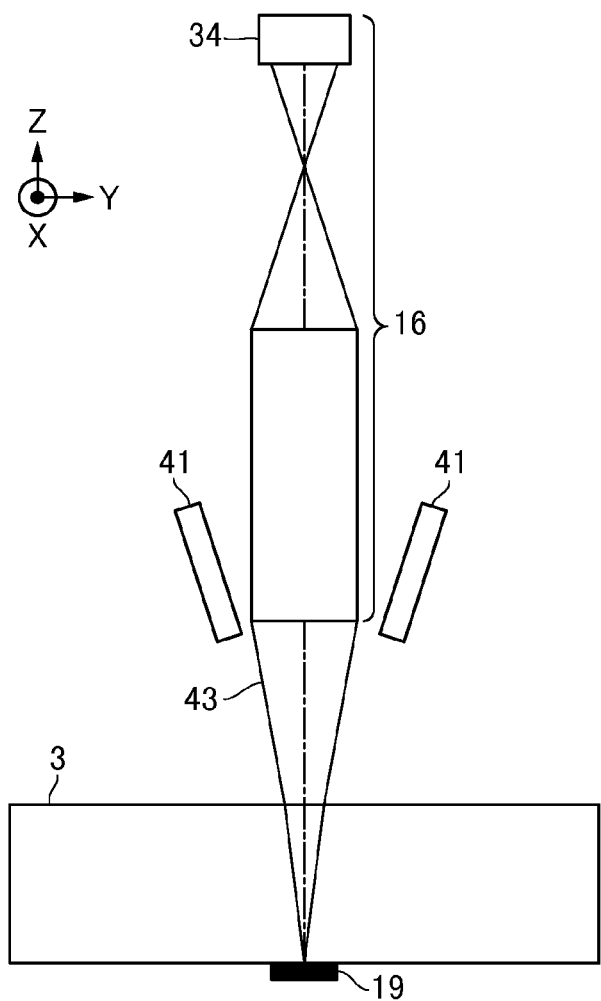
FIG. 12 is a state diagram illustrating measurement of a back-side mark by the wafer alignment detection system.

Next, a description will be given of a case where the image autofocus measurement method is applied when the mark 19 is arranged on the back side of the wafer 3 with reference to FIGS. 11 and 12. Also, when the mark 19 is arranged on the back side of the wafer 3, the AF detection system 41 firstly projects the AF light 42 onto the surface of the wafer 3 and then receives reflection light. At this time, the control unit C drives the wafer stage 4 such that the position of the received reflection light comes to the center of the AF detecting sensor 65 in the AF detection system 41, so that the focus position on the surface of the wafer 3 can be acquired. Then, the control unit C can substantially align the focus position of the wafer alignment detection system 16 with the surface of the wafer 3 using the acquired focus position. FIG. 12 is a diagram illustrating a manner in which the wafer alignment detection system 16 irradiates the mark 19 with the measurement light 43 with the wafer alignment detection system 16 being substantially focused on the surface of the wafer 3. In the state shown in FIG. 12, the infrared light (measurement light) 43 illuminated onto the mark 19 provided on the back side of the wafer 3 is not imaged on the photoelectric conversion element 34 in the wafer alignment detection system 16.

Figure 13:
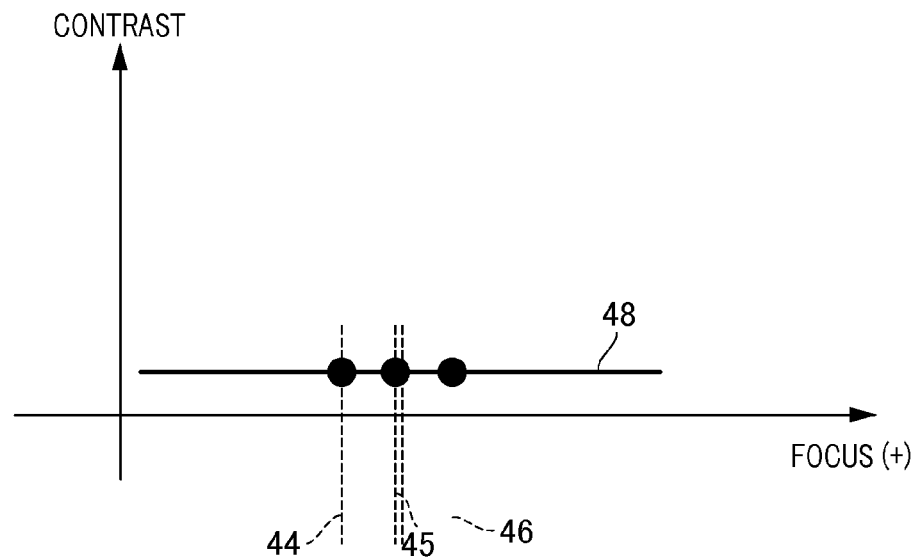
FIG. 13 is a graph illustrating a curve obtained by the conventional image autofocus measurement.

FIG. 13 is a graph illustrating a contrast curve 48 obtained by performing image autofocus measurement from the state shown in FIG. 12 using the wafer alignment detection system 16. The contrast is low at the focus positions 44, 45, and 46, and thus, the mark 19 provided on the back side of the wafer 3 cannot be detected. When the mark 19 is provided on the back side of the wafer 3, the wafer 3 has a thickness of several hundreds of μm, and thus, the mark 19 provided on the back side of the wafer 3 cannot be quickly detected during image autofocus measurement based on the surface of the wafer 3 detected by the AF detection system 41. If the measurement range of image autofocus measurement based on the surface of the wafer 3 is largely increased, the mark 19 provided on the back side of the wafer 3 can be detected by the wafer alignment detection system 16 even when the wafer 3 has a thickness of several hundreds of μm. However, in this case, the number of measurement points significantly increases, resulting in an increase in measurement time and a reduction in throughput.

Figure 14:
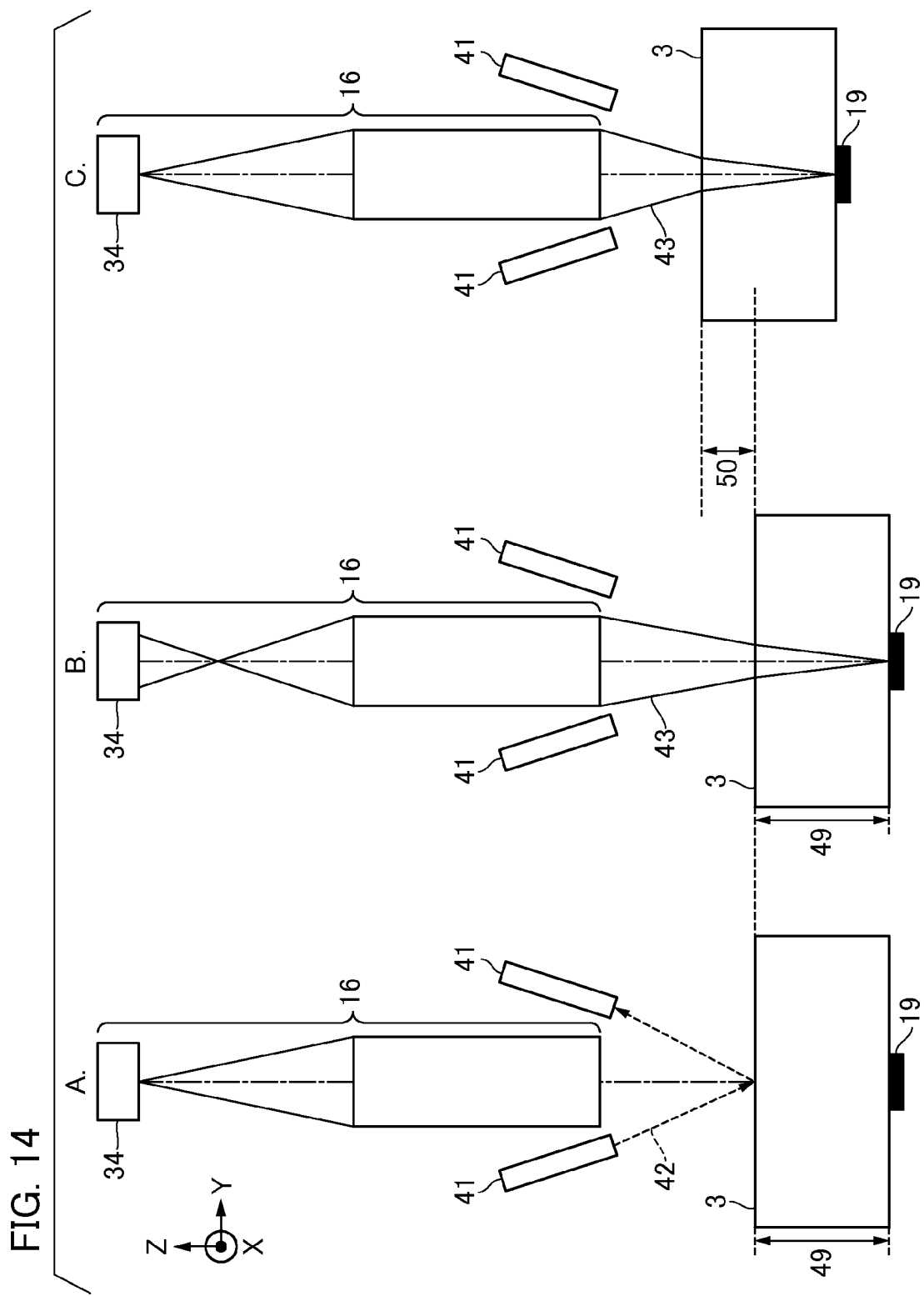
FIGS. 14A to 14C are diagrams illustrating driving of a wafer stage upon offset correction.

Next, with reference to FIGS. 14A to 14C, a description will be given of a method for quickly determining the best focus position of the wafer alignment detection system 16 even when the mark 19 is provided on the back side of the wafer 3. In the method, the starting point of image autofocus measurement is determined by using the thickness and the refractive index of the wafer 3. On the basis of the thickness and the refractive index of the wafer 3 input to an input unit 18 shown in FIG. 3, a calculator 17 calculates an offset amount for adjusting the focus of the wafer alignment detection system 16 on the mark 19 provided on the back side of the wafer 3 and then instructs the wafer stage 4 to drive by the offset amount. FIG. 14A is a diagram illustrating a manner in which the surface of the wafer 3 with the mark 19 provided on the back side thereof is being detected by the AF detection system 41. When the AF detection system 41 is remained in the state of detecting the surface of the wafer 3 as shown in FIG. 14A, the mark 19 cannot be detected by the wafer alignment detection system 16 which is substantially focused on the surface of the wafer 3. FIG. 14B is a diagram illustrating a manner in which the measurement light 43 illuminated onto the mark 19 provided on the back side of the wafer 3 at this time is not imaged on the photoelectric conversion element 34 in the wafer alignment detection system 16. Since the wafer 3 has the thickness 49 of several hundreds of μm, the wafer alignment detection system 16 is defocused by an amount (an offset amount 50) corresponding to the thickness in FIG. 14B.

The offset amount 50 is calculated by the calculator 17 based on the thickness 49 and the refractive index of the wafer 3 input to the input unit 18. The control unit C drives the wafer stage 4 in the Z direction by the offset amount 50 calculated by the calculator 17 from the state where the surface of the wafer 3 has been measured by the AF detection system 41 as shown in FIG. 14A. Thus, as shown in FIG. 14C, the wafer alignment detection system 16 can be focused on the mark 19 provided on the back side of the wafer 3. The offset amount 50 can be calculated by the ratio of (the thickness 49 of the wafer 3)/(the refractive index of the wafer 3). When the wafer 3 is a Si substrate having a thickness of 200 μm, the offset amount 50 is about 57 μm by the ratio of 200 μm/3.5 (the refractive index of Si). As described above, if the offset amount 50 calculated by the thickness 49 and the refractive index of the wafer 3 is used, image autofocus measurement can be quickly performed even for the mark 19 provided on the back side of the wafer 3.

Figure 15:
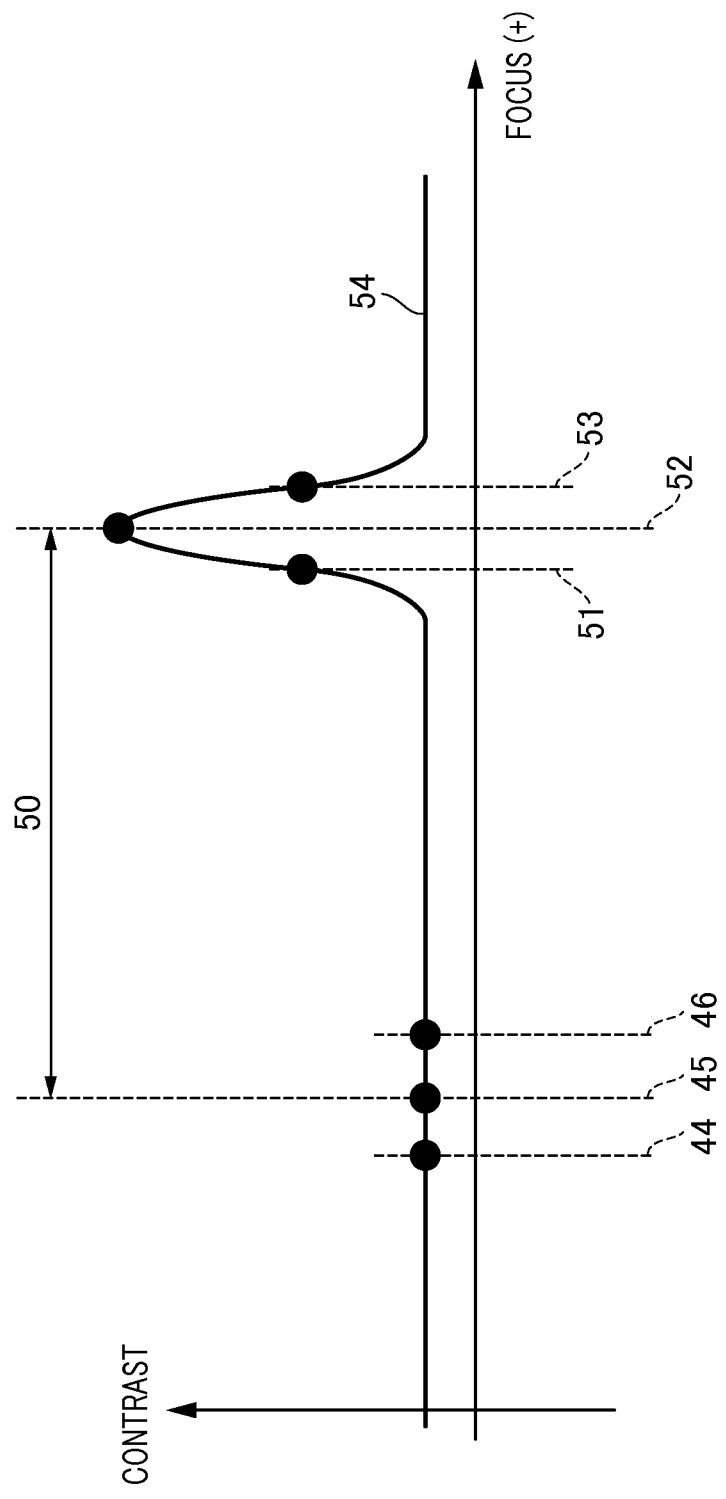
FIG. 15 is a graph illustrating the relationship between a contrast curve and an offset.

FIG. 15 (In particular, the right side part in FIG. 15) is a graph illustrating the contrast curve 54 obtained by performing image autofocus measurement from the state shown in FIG. 14C using the wafer alignment detection system 16. The contrast is high at the focus positions 51, 52, and 53 in FIG. 15, and thus, FIG. 15 indicates the fact that the mark 19 provided on the back side of the wafer 3 can be detected by the wafer alignment detection system 16. FIG. 13 is a contrast curve illustrating the state shown in FIG. 12 (and FIG. 14B), i.e., the state where image autofocus measurement is performed from the surface of the wafer 3. Thus, the contrast curve shown in FIG. 13 corresponds to the left side part of the contrast curve including the focus positions 44 to 46 shown in FIG. 15. The difference between the focus positions 52 and 45 in a contrast curve 54 shown in FIG. 15 means the offset amount 50. From data mirroring the relationship between a focus position and contrast as shown in FIG. 15, the wafer alignment detection system 16 can quickly determine the position of the mark 19 provided on the back side of the wafer 3 with high accuracy.

In the above description, the thickness and the refractive index of the wafer 3 are input to the input unit 18, and then the calculator 17 calculates the ratio of (the thickness 49 of the wafer 3)/(the refractive index of the wafer 3) to thereby calculate the offset amount 50. However, the offset amount 50 may also be directly input to the input unit 18. When the offset amount 50 is directly input to the input unit 18, time and labor are required to manually calculate the ratio of (the thickness of the wafer 3)/(the refractive index of the wafer 3) but the calculator 17 can be removed, which is advantageous in terms of costs. The input unit 18 and the calculator 17 constitute a processing unit P that determines information indicating the offset amount 50, i.e., the focus state of the image of the mark 19 in the wafer alignment detection system 16.

Figure 16:
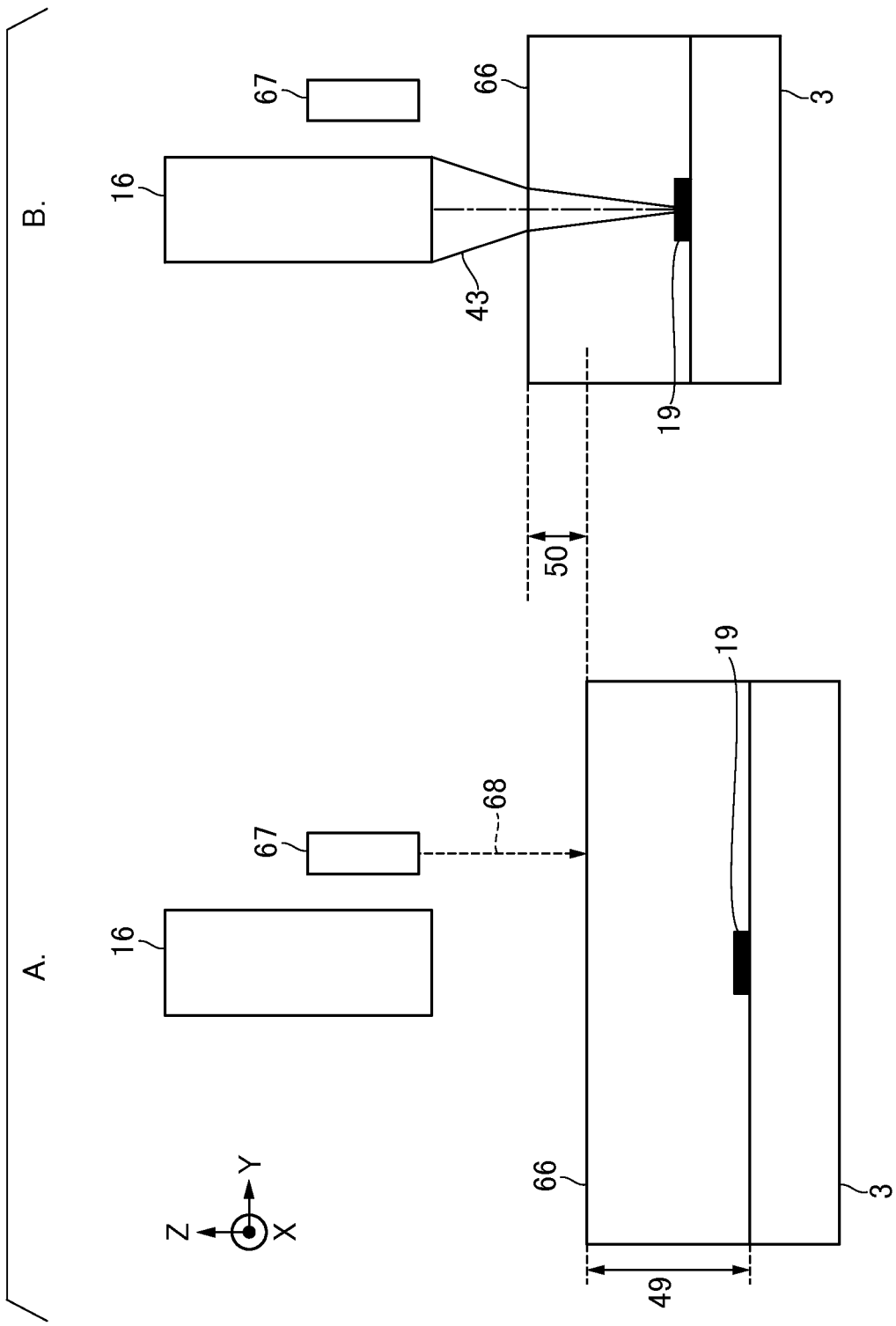
FIGS. 16A and 16B are state diagrams illustrating measurement of a mark provided on the back side of a resist.

In the present embodiment, image autofocus measurement for the mark 19 provided on the back side of the wafer 3 is performed by using the AF detection system 41 that causes visible light to obliquely incident on the wafer 3 and the wafer alignment detection system 16 that employs infrared light. In contrast, the position of the mark 19 provided on the back side of a resist 66 which is coated on the wafer 3 can further be detected by using the AF detection system 41 and the wafer alignment detection system 16. FIGS. 16A and 16B are diagrams illustrating how image autofocus measurement for the mark 19 provided on the back side of the resist 66 is performed. In this case, visible light emitted from the aforementioned AF detection system 41 passes through the resist 66 so that the position on the surface of the resist 66 cannot be detected. Thus, a focus detection system 67 is used for detecting the position on the surface of the resist 66. The focus detection system 67 is configured within the wafer alignment detection system 16. The focus detection system 67 may include a fluid micrometer (an air micrometer) system. The fluid micrometer system jets air (gas) 68 toward the surface of the resist 66 to thereby detect the surface height of the resist 66 using the strength (pressure) of the air reflected from the resist 66. Image autofocus measurement for the mark 19 provided on the back side of the resist 66 can be performed based on the surface height of the resist 66, the thickness 49 of the resist 66, and the refractive index of the resist 66 which have been detected by the focus detection system 67.

The control unit C drives the wafer stage 4 by the offset amount 50 from the state where the surface position of the resist 66 has been measured by the focus detection system 67 as shown in FIG. 16A. Thus, the control unit C can substantially align the focus of the wafer alignment detection system 16 with the mark 19 provided on the back side of the resist 66 as shown in FIG. 16B. The offset amount 50 can be calculated by the ratio of (the thickness 49 of the resist 66)/(the refractive index of the resist 66). For example, when the resist 66 has a thickness of 200 μm, the offset amount 50 is about 133 μm by the ratio of 200 μm/1.5 (the refractive index of the resist 66). Image autofocus measurement is started from the state shown in FIG. 16B, so that the best focus position of the mark 19 provided on the back side of the resist 66 can be determined. As described above, when the offset amount 50 calculated from the thickness and the refractive index of an object to be measured having the mark 19 on the back side thereof is used, image autofocus measurement for the mark 19 provided on the back side of an object to be measured other than the wafer 3 can also be performed.

As a sensor for measuring the surface of the resist 66, a capacitive sensor or the like may also be used instead of the focus detection system 67. The capacitive sensor detects the electric charge amounts generated upon application of voltage to the surface of the resist 66 to thereby detect the height from the capacitive sensor to the surface of the resist 66. The electric charge amounts generated upon application of voltage increase if the distance from the capacitive sensor to the surface of the resist 66 is short, whereas the electric charge amounts generated upon application of voltage decrease if the distance from the capacitive sensor to the surface of the resist 66 is long. As described above, the capacitive sensor detects the electric charge amounts generated upon application of constant voltage to the capacitive sensor and the surface of the resist 66 to thereby calculate the distance from the capacitive sensor to the surface of the resist 66.

When the exposure apparatus E exposes twenty five wafers 3 in one lot, image autofocus measurement is only performed for the mark (first mark) 19 of the first wafer 3. For the mark (second mark) 19 of the second or subsequent wafer 3, the focus can be adjusted on the mark 19 provided on the back side of the wafer 3 only by using the measurement result obtained by the AF detection system 41. For the first wafer 3 in one lot, the control unit C drives the wafer stage 4 by the offset amount 50 from the measurement value obtained by the AF detection system 41 to thereby perform image autofocus measurement for the mark 19 provided on the back side of the wafer 3 as shown in FIG. 14C. At this time, the control unit C determines a difference 69 between the best focus position of the wafer alignment detection system 16 with respect to the mark 19 provided on the back side of the wafer 3, which has been calculated by image autofocus measurement, and the focus position on the surface of the wafer 3 measured by the AF detection system 41. For the second or subsequent wafer 3, the control unit C drives the wafer stage 4 by the amount of the difference 69 determined by image autofocus measurement for the first wafer 3 from the state where the surface position of the wafer 3 has been measured by the AF detection system 41. Then, the mark 19 provided on the back side of the wafer 3 is measured by the wafer alignment detection system 16 in this state. In this manner, alignment measurement can be performed for other twenty four wafers 3 with high accuracy only by performing image autofocus measurement only for the first wafer 3.

Figure 17:
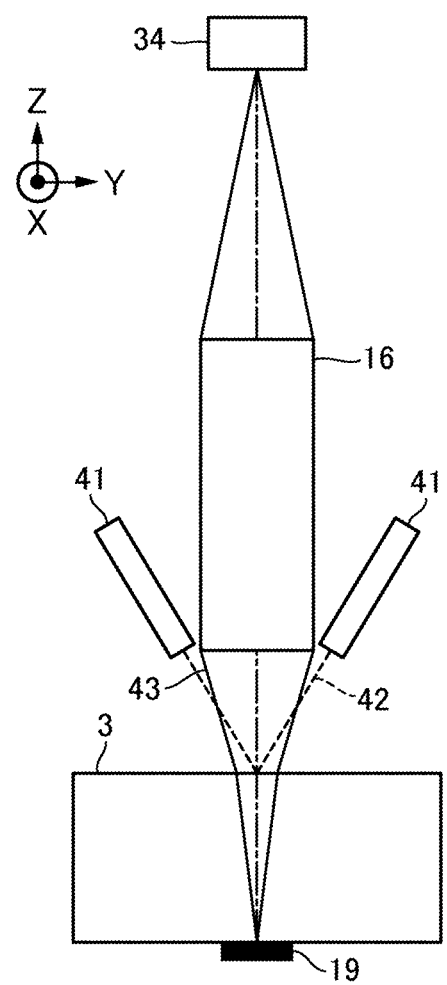
FIG. 17 is a diagram illustrating measurement of the thickness of a wafer.

Next, a description will be given of measurement of thickness of the Si wafer 3 using the wafer alignment detection system 16 and the AF detection system 41. FIG. 17 is a diagram illustrating how the thickness of the wafer 3 is measured by using the wafer alignment detection system 16 and the AF detection system 41. The AF detection system 41 measures (detects) the second focus position on the surface of the wafer 3, whereas the wafer alignment detection system 16 measures (detects) the first focus position of the mark 19 provided on the back side of the wafer 3. The calculator 17 can calculate the thickness of the wafer 3 based on the difference between the focus position on the surface of the wafer 3 measured by the AF detection system 41 and the focus position on the back side of the wafer 3 detected by the wafer alignment detection system 16. Here, the difference can be seen as the geometrical thickness of the wafer 3. In contrast, the calculator 17 multiplies the difference by the refractive index of Si which is the material of the wafer 3 so that the thickness of the wafer 3 can be calculated as the optical thickness thereof. While it is preferable that a value previously input to the input unit 18 is used as the refractive index of Si, a value previously input to the control unit C within the exposure apparatus E may also be used when the detection device D is installed within the exposure apparatus E as in the present embodiment.

Figure 18:
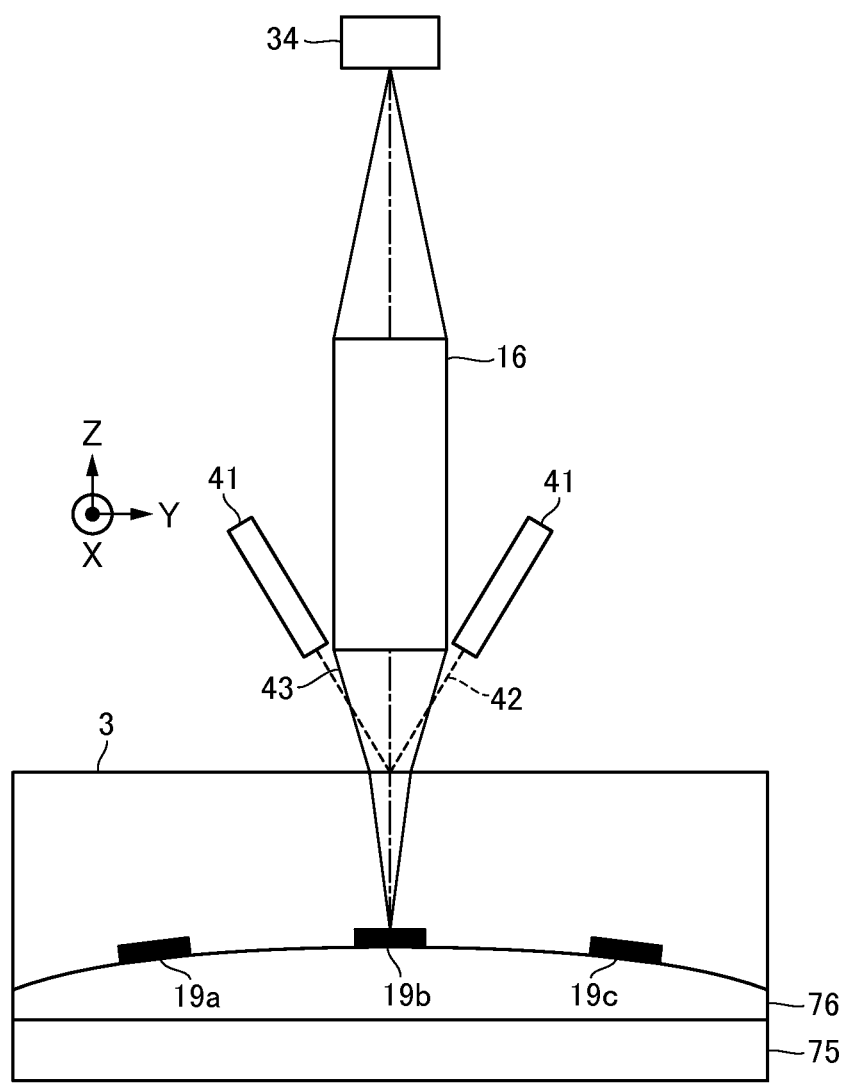
FIG. 18 is a diagram illustrating measurement of the thickness of a Si plate constituting a bonded wafer.

Only the thickness of the Si plate which is a part of the bonded wafer can be measured by applying the thickness measurement as described above. Hereinafter, the same reference numeral as that used in the Si wafer is used to denote the Si plate for ease of explanation. FIG. 18 is a diagram illustrating how only the thickness of an Si plate 3 of the bonded wafer is measured. Here, an example of the bonded wafer includes one in which a base material 75 is adhered to the Si plate 3 via an adhesive 76. In this case, the Si plate 3 is subject to thinning while holding the flexing thereof, where the front side of the Si plate 3 is not in parallel with the back side thereof. The control unit C can also calculate the thickness of such the Si plate 3 in the same manner as described above. In particular, even when a plurality of alignment marks 19a to 19c having different image heights is arranged as shown in FIG. 18, the control unit C can specify the variation in thickness of the entire surface of the wafer by performing the aforementioned thickness measurement.

Figure 19:
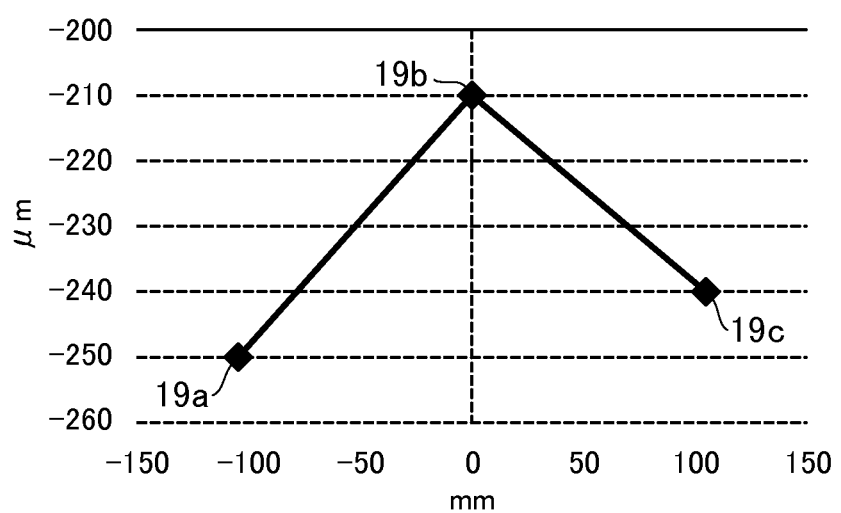
FIG. 19 is a graph illustrating the result of measurement of the thickness of the Si plate on the portion on which a mark is provided.

FIG. 19 is a graph illustrating the results of measuring the thickness of the Si plate 3 at three positions where the alignment marks 19a to 19c are provided as shown in FIG. 18. In FIG. 19, the horizontal axis denotes the distance in the X direction on the basis of the central image height (the arrangement position of the alignment mark 19b). On the other hand, the vertical axis denotes the thickness of the Si plate 3 which is obtained by multiplying the focus positions of the alignment marks 19a to 19c detected by the wafer alignment detection system 16 by the refractive index of Si on the basis of the setting of the surface of the Si plate 3 detected by the AF detection system 41 to 0 μm and is displayed in the negative direction. According to FIG. 19, the thickness of the Si plate 3 is thinned by setting a set value to 200 μm and the thickness of the Si plate 3 at the central image height is 210 μm but the thicknesses of the Si plate 3 at the peripheral image heights are 240 μm and 250 μm. In other words, it can be seen that the thickness of the Si plate 3 not only has a difference between the central portion and the peripheral portion of the Si plate 3 but also has a difference between the left and right sides of the peripheral portion only. Note that the control unit C can calculate three-dimensional information for the wafer by expanding the number of measurement points to the entire surface of the wafer for measurement. As described above, according to the wafer alignment detection system 16 and the AF detection system 41 of the present embodiment, the thickness of the Si wafer or the Si plate of the bonded wafer can be readily measured within the exposure apparatus E.

Furthermore, a description will be given of focus correction using the wafer alignment detection system 16 and the AF detection system 41. In this case, focus correction is performed by measuring a stage reference plate 11 shown in, for example, FIG. 3 by the AF detection system 41 and the wafer alignment detection system 16. More specifically, the AF detection system 41 firstly performs focus measurement for the stage reference plate 11. Next, the wafer alignment detection system 16 performs image autofocus measurement for the mark provided on the stage reference plate 11. Then, the control unit C matches the focus measurement values obtained by focus measurement and image autofocus measurement to thereby perform correction. In this manner, the focus measurement value obtained by the AF detection system 41 and the focus measurement value obtained by image autofocus measurement by the wafer alignment detection system 16 become equal to each other for the mark provided on the stage reference plate 11. While the mark provided on the stage reference plate 11 is used as a reference, the mark provided on the wafer 3 may also be used as a reference as long as the focus measurement values can be acquired from the AF detection system 41 and the wafer alignment detection system 16.

As described above, the detection device constituted by the wafer alignment detection system 16 and the AF detection system 41 can favorably perform image autofocus measurement even for the mark 19 provided on the wafer 3 or the mark 19 provided on the back side of an object to be measured other than the wafer 3. In addition, the detection device can detect the thickness of the wafer 3 or the thickness of an object to be measured other than the wafer 3 (the thickness of the Si wafer or the Si plate) within the exposure apparatus E. In this manner, when the control unit C determines that the variation in thickness of the wafer 3 has occurred by automatically and periodically monitoring the thickness of the wafer 3 acquired from the calculator 17, the variation in thickness of the wafer 3 can be feedback to the thinning device that performs thinning processing for the wafer 3 after exposure processing. By submitting the feedback of the detected thickness to not only the thinning device but also the etching device that performs etching processing for the wafer 3 after exposure processing, a desired through-VIA can be formed at the optimum etching time, resulting in an improvement in yield of devices. Furthermore, the detection device can also specify the variation in local thickness of the in-plane wafer, so that the difference between etching times for the in-plane wafer can be made in the etching device, resulting in expectation for improvement in yield of devices.

As described above, according to the present embodiment, a detection device that is advantageous for quickly detecting the position of the mark provided on the back side of an object to be measured such as a Si wafer and the thickness of the object to be measured with high accuracy may be provided.

Figure 20:
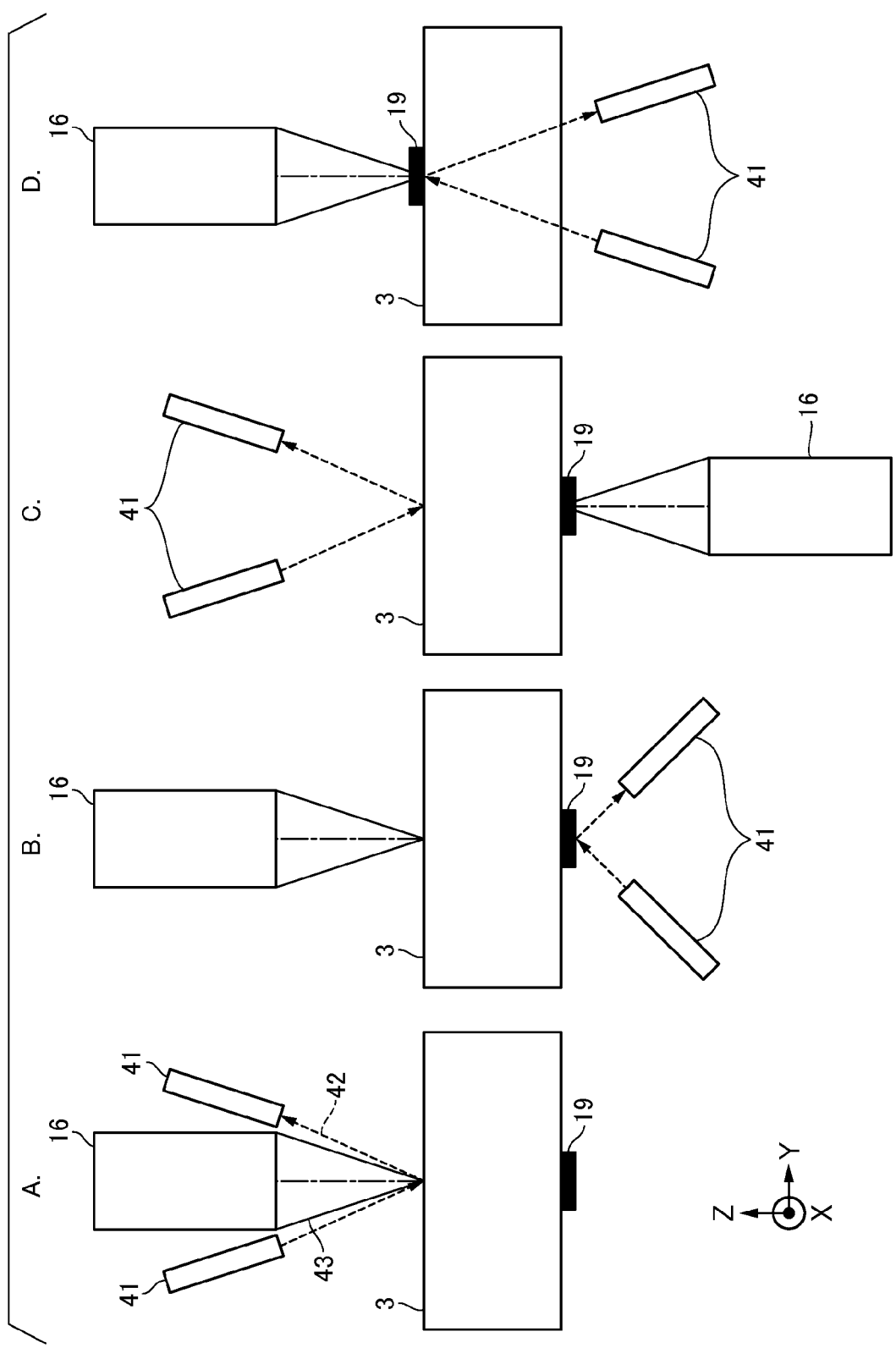
FIGS. 20A to 20D are diagrams illustrating another exemplary arrangement of a wafer alignment detection system and an AF detection system.

While, in the above description, the AF detection system 41 which is arranged outside (outer circumferential region) of the wafer alignment detection system 16 is used as the AF detection system 41, the present invention is not limited to such an AF detection system. FIGS. 20A to 20D are diagrams illustrating another exemplary arrangement of the wafer alignment detection system 16 and the AF detection system 41. FIG. 20A is a diagram illustrating the arrangement of the first embodiment in which the wafer alignment detection system 16 and the AF detection system 41 are arranged on the front side of the wafer 3 for comparison. In contrast, when the wafer alignment detection system 16 or the AF detection system 41 can be arranged on the back side of the wafer 3, the wafer alignment detection system 16 and the AF detection system 41 can also be separately arranged on the front side and the back side of the wafer 3, respectively, as described below. Firstly, FIG. 20B is a diagram illustrating an exemplary arrangement in which the wafer alignment detection system 16 which uses infrared light as a light source is arranged on the front side of the wafer 3 and the AF detection system 41 which uses visible light as a light source is arranged on the back side of the wafer 3 in order to detect the mark 19 provided on the back side of the wafer 3. Next, FIG. 20C is a diagram illustrating an exemplary arrangement in which the wafer alignment detection system 16 which uses visible light as a light source is arranged on the back side of the wafer 3 and the AF detection system 41 which uses infrared light as a light source is arranged on the front side of the wafer 3 in order to detect the mark 19 provided on the back side of the wafer 3. FIG. 20D is a diagram illustrating an exemplary arrangement in which the wafer alignment detection system 16 which uses visible light as a light source is arranged on the front side of the wafer 3 and the AF detection system 41 which uses infrared light as a light source is arranged on the back side of the wafer 3 in order to detect the alignment mark 19 provided on the front side of the wafer 3. Furthermore, in this case, the thickness of the wafer 3 may be measured by the focus detection system 67 shown in FIGS. 16A and 16B instead of the AF detection system 41.

Second Embodiment

In the first embodiment, the focus position of the wafer alignment detection system 16 with respect to the mark 19 provided on the back side of the wafer 3 is quickly acquired by using the focus detection systems 41 and 67 for detecting the surface position of the wafer 3. In contrast, in the present embodiment, the one which is switchable between two detection modes, i.e., the first detection mode and the second detection mode is used as the wafer alignment detection system 16. Furthermore, in the present embodiment, the focus detection systems 41 and 67 for detecting the surface position of the wafer 3, which are employed in the first embodiment, are not used. In the first detection mode, the wafer alignment detection system 16 detects the mark 19 with the first detection accuracy while changing spacing between the mark 19 and the wafer alignment detection system 16 by the first pitch. In the second detection mode, the wafer alignment detection system 16 detects the mark 19 with the second detection accuracy while changing spacing between the mark 19 and the wafer alignment detection system 16 by the second pitch. At this time, it is assumed that the second pitch is smaller than the first pitch and the second detection accuracy is higher than the first detection accuracy. In other words, the first detection mode is a wide pitch detection mode that has low detection accuracy but can detect a wide area at a time. On the other hand, the second detection mode is a fine pitch detection mode that has a narrow detection area but has high detection accuracy.

Figure 21:
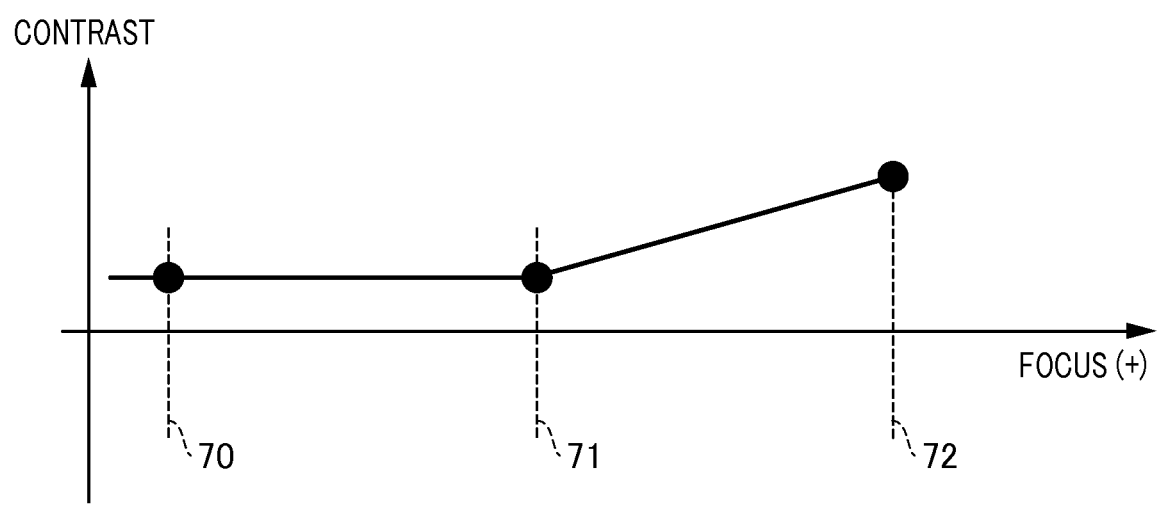
FIG. 21 is a graph illustrating a contrast curve with a wide pitch.
Figure 22:
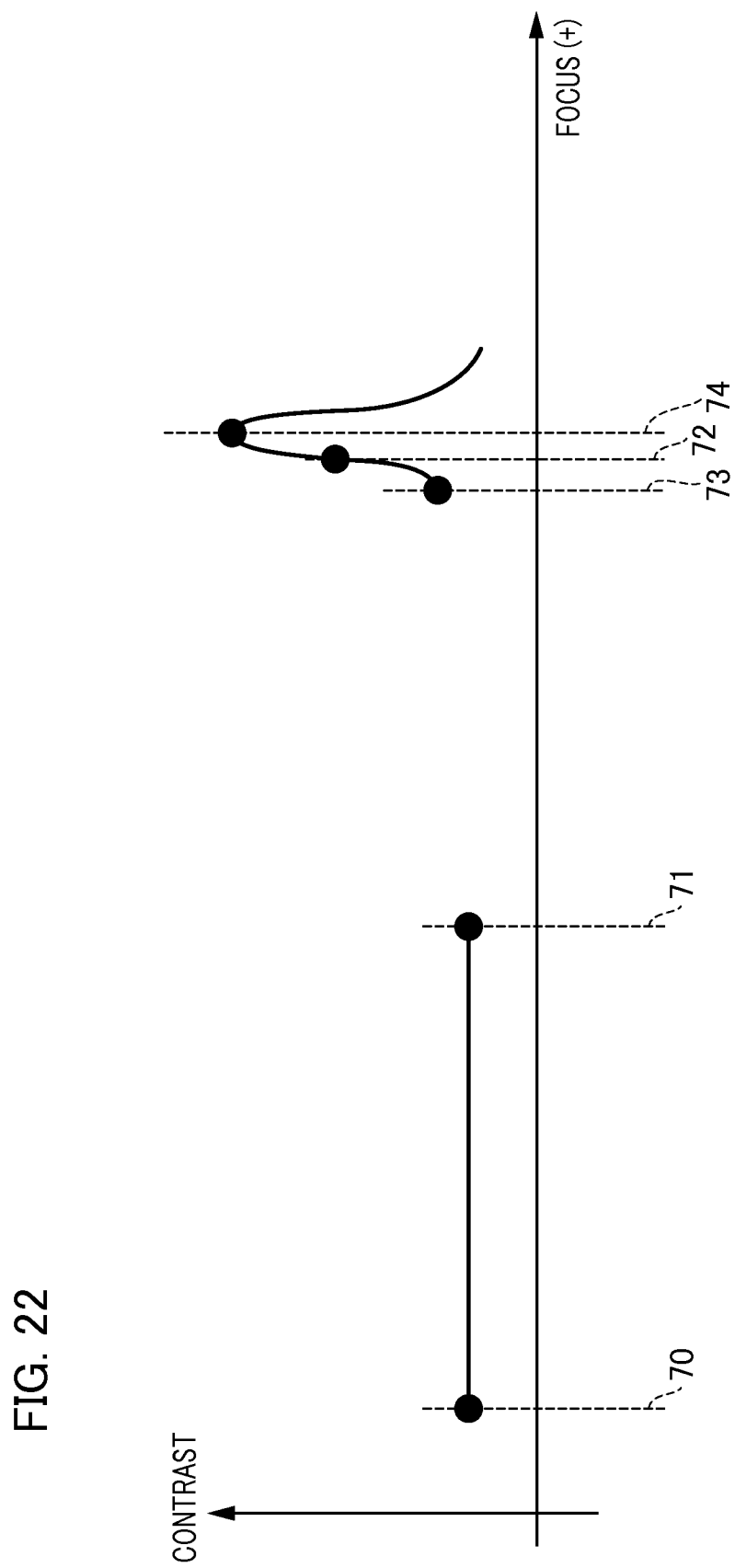
FIG. 22 is a graph illustrating a contrast curve with a fine pitch.

FIG. 21 is a graph illustrating a contrast curve obtained by measuring the mark 19 provided on the back side of the wafer 3 using the wafer alignment detection system 16 arranged on the front side of the wafer 3 in the first wide pitch detection mode. By performing image autofocus measurement in the first detection mode in which the image autofocus measurement pitch is wider than the conventional image autofocus measurement pitch of the wafer alignment detection system 16, a schematic focus position 72 for measuring the mark 19 can be quickly acquired. Next, image autofocus measurement is started from the focus position 72 by switching the detection mode of the wafer alignment detection system 16 to the second detection mode having high detection accuracy. As described above, by performing image autofocus measurement in two steps by switching the detection mode of the wafer alignment detection system 16, the best focus position for measuring the mark 19 can be quickly acquired. FIG. 22 is a graph illustrating a contrast curve obtained by performing image autofocus measurement in the second detection mode from the focus position 72 obtained in the first detection mode. It can be seen that the best focus position 74 is acquired in the graph shown in FIG. 22.

(Device Manufacturing Method)

Next, a description will be given of a method for manufacturing a device (semiconductor device, liquid crystal display device, or the like) according to one embodiment of the present invention. The semiconductor device is manufactured by a front-end process in which an integrated circuit is formed on a wafer and a back-end process in which an integrated circuit chip is completed as a product from the integrated circuit on the wafer formed in the front-end process. The front-end process includes a step of exposing a wafer coated with a photosensitizer using the above-described exposure apparatus and a step of developing the exposed wafer. The back-end process includes an assembly step (dicing and bonding) and a packaging step (sealing). The liquid crystal display device is manufactured by a process in which a transparent electrode is formed. The process of forming a transparent electrode includes a step of applying a photosensitizer to a glass substrate on which a transparent conductive film is deposited, a step of exposing the glass substrate coated with the photosensitizer using the above-described exposure apparatus, and a step of developing the exposed glass substrate. According to the device manufacturing method of the present embodiment, a device having a higher quality than that of the conventional device may be manufactured.

While the embodiments of the present invention have been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2012-231653 filed on Oct. 19, 2012 which is hereby incorporated by reference herein in its entirety.

What is claimed is:

1. A detection device that detects a mark provided on the back side of an object, the detection device comprising:
    a first detection unit configured to detect the mark from a front side of the object by using a first light that transmits through the object and is reflected by the mark;
    a second detection unit configured to detect a surface position of the object by using a second light that is reflected by a part of the front side of the object, the part being a mark-free area of the front side of the object; and
    a processing unit,
    wherein the processing unit is configured to acquire a first focus position based on an image of the mark detected by the first detection unit and to acquire a second focus position based on the surface position detected by the second detection unit and to determine a thickness of the object based on a difference between the first focus position and the second focus position.

2. The detection device according to claim 1,
    wherein the processing unit determines an offset amount acquired by dividing a preset thickness of the object by the refractive index of the object and acquires the first focus position based on information indicating a focus state of the image of the mark;
    wherein the information is acquired after moving the object by the offset amount from a position where the second focus position is acquired.

3. The detection device according to claim 1, wherein the first detection unit illuminates the mark with infrared light.

4. The detection device according to claim 1, wherein information regarding the refractive index of the object is input to the processing unit in advance.

5. The detection device according to claim 1, wherein the second detection unit illuminates the part of the area with visible light.

6. The detection device according to claim 1, wherein the thickness is a geometrical thickness.

7. The detection device according to claim 1, wherein the processing unit determines the thicknesses at plural positions based on the first focus position and the second focus position acquired at the plural positions of the object and determines three-dimensional information of the object based on the plural thicknesses.

8. An exposure apparatus that exposes a substrate, the exposure apparatus comprising:
    a detection device that detects a mark provided on the back side of the substrate serving as an object or a mark provided on the back side of a photosensitizer which is applied on the substrate and serves as an object;
    a substrate holding unit configured to hold the substrate; and
    a control unit that controls the operation of at least the detection device and the substrate holding unit,
    wherein the detection device comprises:
    a first detection unit configured to detect the mark from a front side of the object by using a first light that transmits through the object and is reflected by the mark;
    a second detection unit configured to detect a surface position of the object by using a second light that is reflected by a part of the front side of the object, the part on which a mark is not provided; and
    a processing unit,
    wherein the processing unit is configured to acquire a first focus position based on an image of the mark detected by the first detection unit and to acquire a second focus position based on the surface position detected by the second detection unit and to determine a thickness of the object based on a difference between the first focus position and the second focus position.

9. The exposure apparatus according to claim 8, wherein information regarding the refractive index of the object is input to the control unit in advance instead of the processing unit.

10. The exposure apparatus according claim 8, wherein the control unit periodically acquires the thickness determined by the processing unit, and, when it is determined that the thickness varies, the control unit provides feedback of the thickness to at least one of a device which applies thinning processing to the substrate after exposure processing and a device which applies etching processing to the substrate after exposure processing.

11. The exposure apparatus according to claim 8, wherein the control unit periodically acquires three-dimensional information determined by the processing unit based on the thickness, and, when it is determined that the three-dimensional information varies, the control unit provides feedback of the three-dimensional information to at least one of a device which applies thinning processing to the substrate after exposure processing and a device which applies etching processing to the substrate after exposure processing.

12. The exposure apparatus according to claim 8, wherein the processing unit determines information indicating a focus state of the image of the mark based on an offset amount acquired by dividing a preset thickness of the object by the refractive index of the object and acquires the first focus position based on information indicating a focus state of the image of the mark;
    wherein the information is acquired after the control unit controls the holding unit to move the object by the offset amount from a position where the second focus position is acquired.

13. A device manufacturing method comprising:
    exposing a substrate using an exposure apparatus; and
    developing the exposed substrate;
    manufacturing the developed substrate,
    wherein the exposure apparatus is an exposure apparatus that exposes a substrate, the exposure apparatus comprising:
    a detection device that detects a mark provided on the back side of the substrate serving as an object or a mark provided on the back side of a photosensitizer which is applied on the substrate and serves as an object;
    a substrate holding unit configured to hold the substrate; and
    a control unit that controls the operation of at least the detection device and the substrate holding unit,
    wherein the detection device comprises:
    a first detection unit configured to detect the mark from a front side of the object by using a first light that transmits through the object and is reflected by the mark;

a second detection unit configured to detect a surface position of the object by using a second light that is reflected by a part of the front side of the object, the part on which a mark is not provided; and a processing unit, wherein the processing unit is configured to acquire a first focus position based on an image of the mark detected by the first detection unit and to acquire a second focus position based on the surface position detected by the second detection unit and to determine a thickness of the object based on a difference between the first focus position and the second focus position.

14. A detecting method comprising:

acquiring a first focus position based on an image of a mark provided on a back side of an object, the image detected by using a first light that transmits through the object and is reflected by the mark; and acquiring a second focus position based on a surface position detected by using a second light reflected by a part of a front side of the object, the part being a mark-free area of the front side of the object; and determining a thickness of the object based on a difference between the first focus position and the second focus position.

* * * * *